(12) United States Patent
Shan et al.

(10) Patent No.: US 12,354,883 B2
(45) Date of Patent: Jul. 8, 2025

(54) OMNI DIRECTIONAL INTERCONNECT WITH MAGNETIC FILLERS IN MOLD MATRIX

(71) Applicant: Intel Corporation, Santa Clara, CA (US)

(72) Inventors: Bohan Shan, Chandler, AZ (US); Dingying Xu, Chandler, AZ (US); Kristof Darmawikarta, Chandler, AZ (US); Srinivas Venkata Ramanuja Pietambaram, Chandler, AZ (US); Hongxia Feng, Chandler, AZ (US); Gang Duan, Chandler, AZ (US); Jung Kyu Han, Chandler, AZ (US); Xiaoying Guo, Chandler, AZ (US); Jeremy D. Ecton, Gilbert, AZ (US); Santosh Tripathi, Portland, OR (US); Bai Nie, Chandler, AZ (US); Haobo Chen, Chandler, AZ (US); Kyle Jordan Arrington, Gilbert, AZ (US); Yue Deng, Chandler, AZ (US); Wei Wei, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 776 days.

(21) Appl. No.: 17/484,315

(22) Filed: Sep. 24, 2021

(65) Prior Publication Data

US 2023/0101629 A1   Mar. 30, 2023

(51) Int. Cl.
*H01L 23/29* (2006.01)
*H01L 21/48* (2006.01)
*H01L 21/56* (2006.01)
*H01L 23/24* (2006.01)
*H01L 23/26* (2006.01)
*H01L 23/538* (2006.01)

(52) U.S. Cl.
CPC .......... *H01L 21/485* (2013.01); *H01L 21/565* (2013.01); *H01L 23/24* (2013.01); *H01L 23/26* (2013.01); *H01L 23/295* (2013.01); *H01L 23/5381* (2013.01)

(58) Field of Classification Search
CPC ..... H01L 21/485; H01L 21/565; H01L 23/24; H01L 23/26; H01L 23/295; H01L 23/5381; H01L 23/481
See application file for complete search history.

(56) References Cited

U.S. PATENT DOCUMENTS

| | | | |
|---|---|---|---|
| 2019/0035744 A1* | 1/2019 | Kawabata | H01L 23/552 |
| 2020/0098621 A1* | 3/2020 | Bharath | H01L 25/18 |
| 2021/0193577 A1* | 6/2021 | Lin | H01L 23/5381 |
| 2022/0293327 A1* | 9/2022 | Ganesan | H01L 23/5227 |

* cited by examiner

*Primary Examiner* — David Vu
*Assistant Examiner* — Brandon C Fox
(74) *Attorney, Agent, or Firm* — Alliance IP, LLC

(57) ABSTRACT

Various embodiments disclosed relate to methods of making omni-directional semiconductor interconnect bridges. The present disclosure includes semiconductor assemblies including a mold layer having mold material, a first filler material dispersed in the mold material, and a second filler material dispersed in the mold material, wherein the second filler material is heterogeneously dispersed.

18 Claims, 20 Drawing Sheets

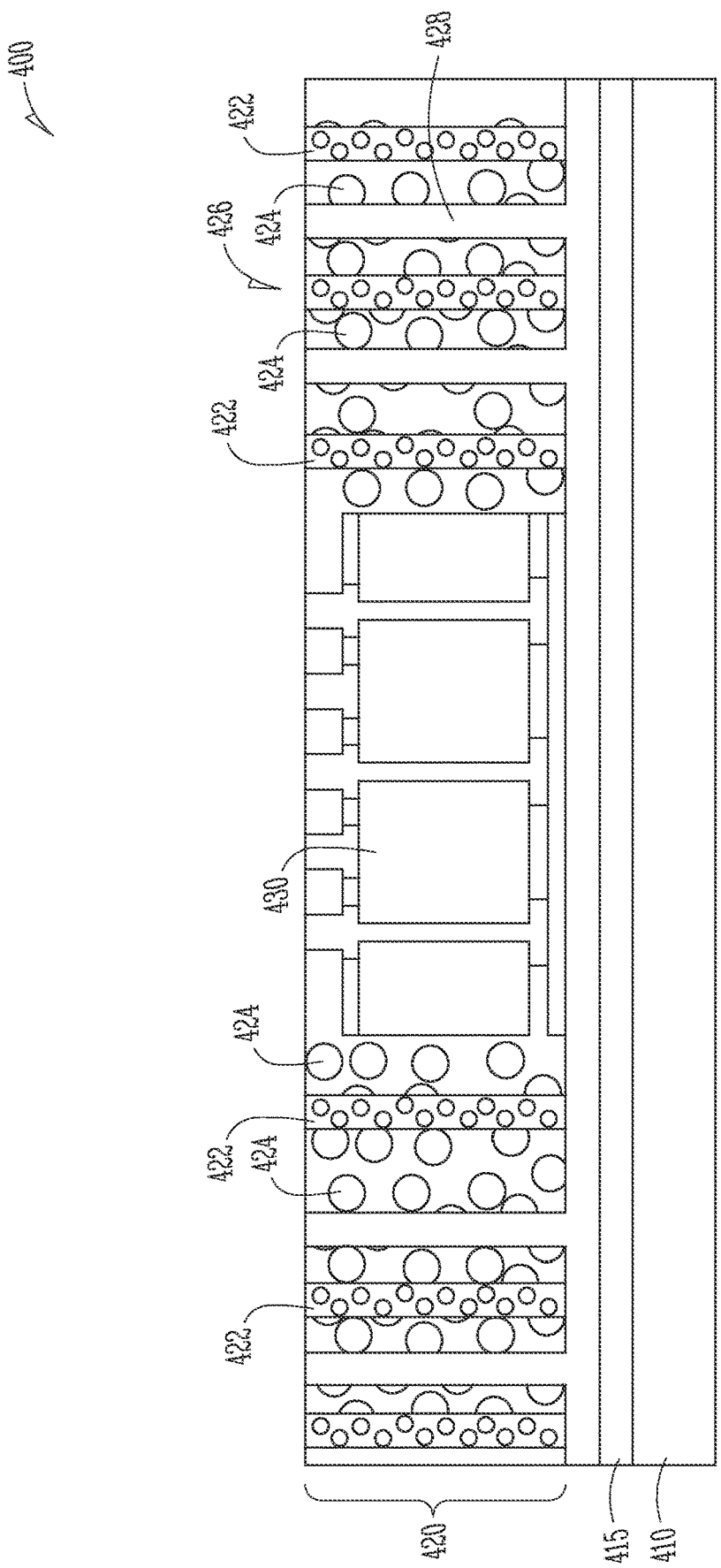

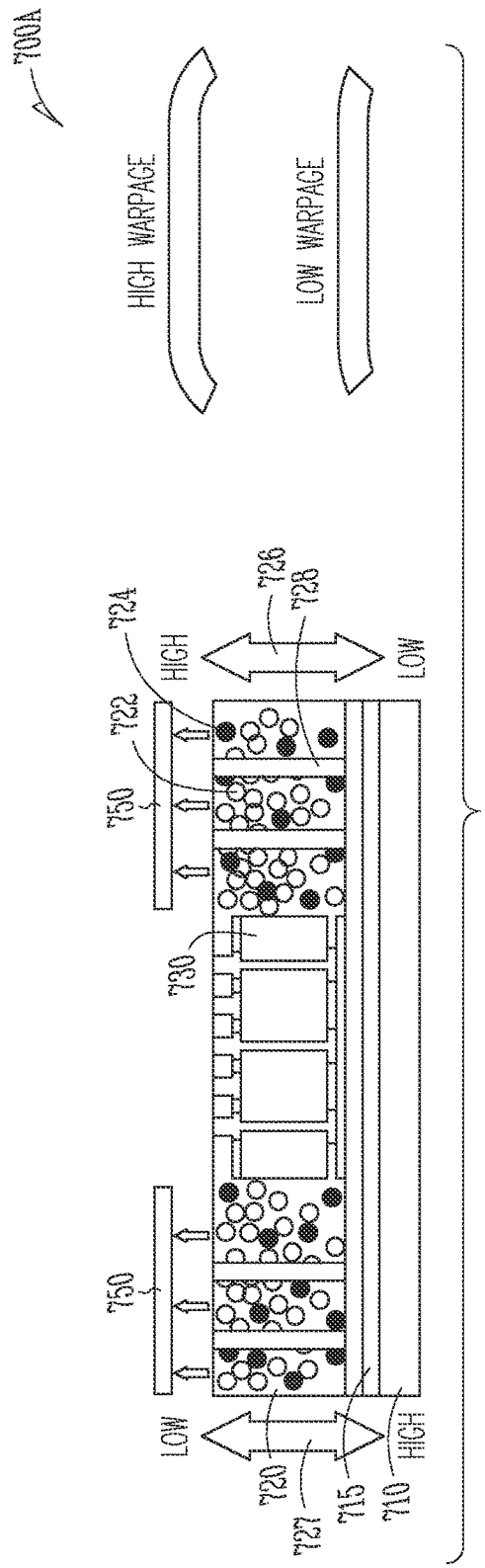
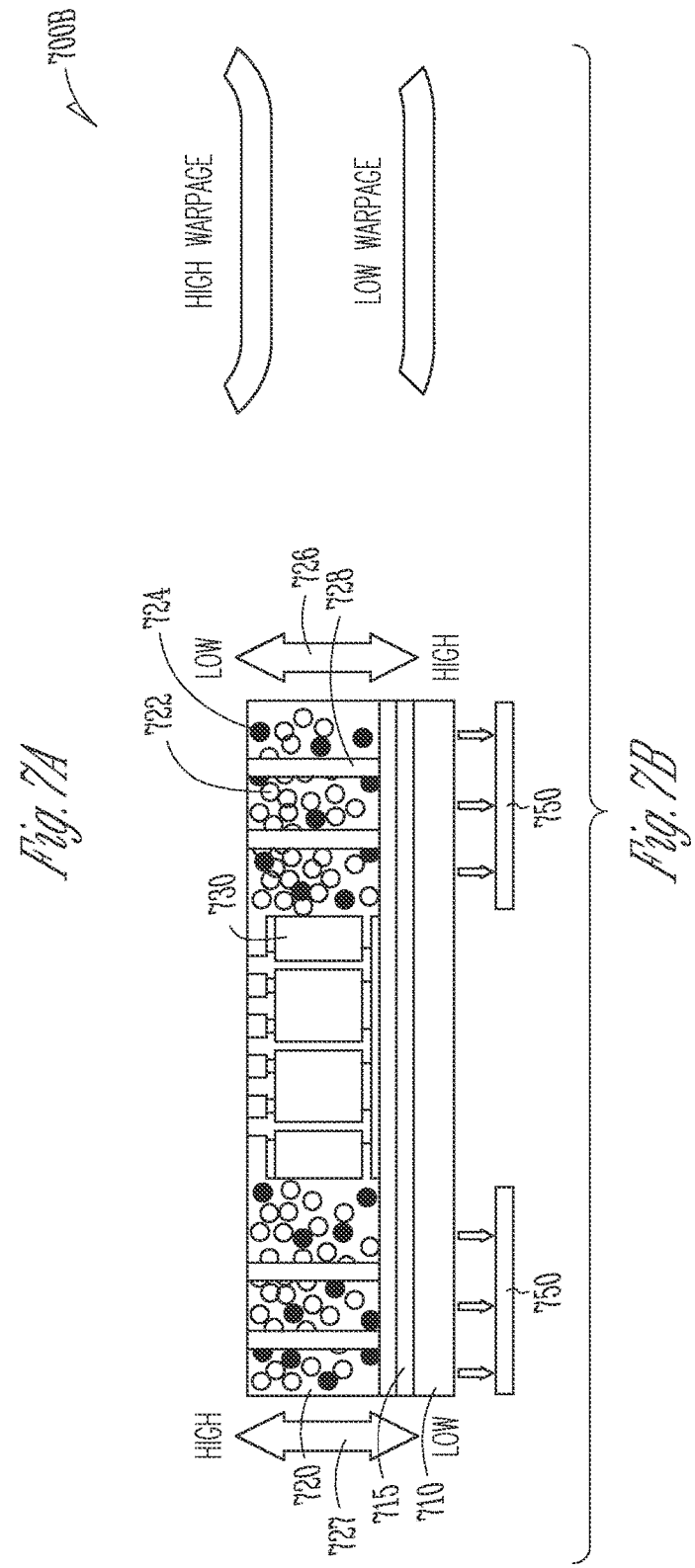

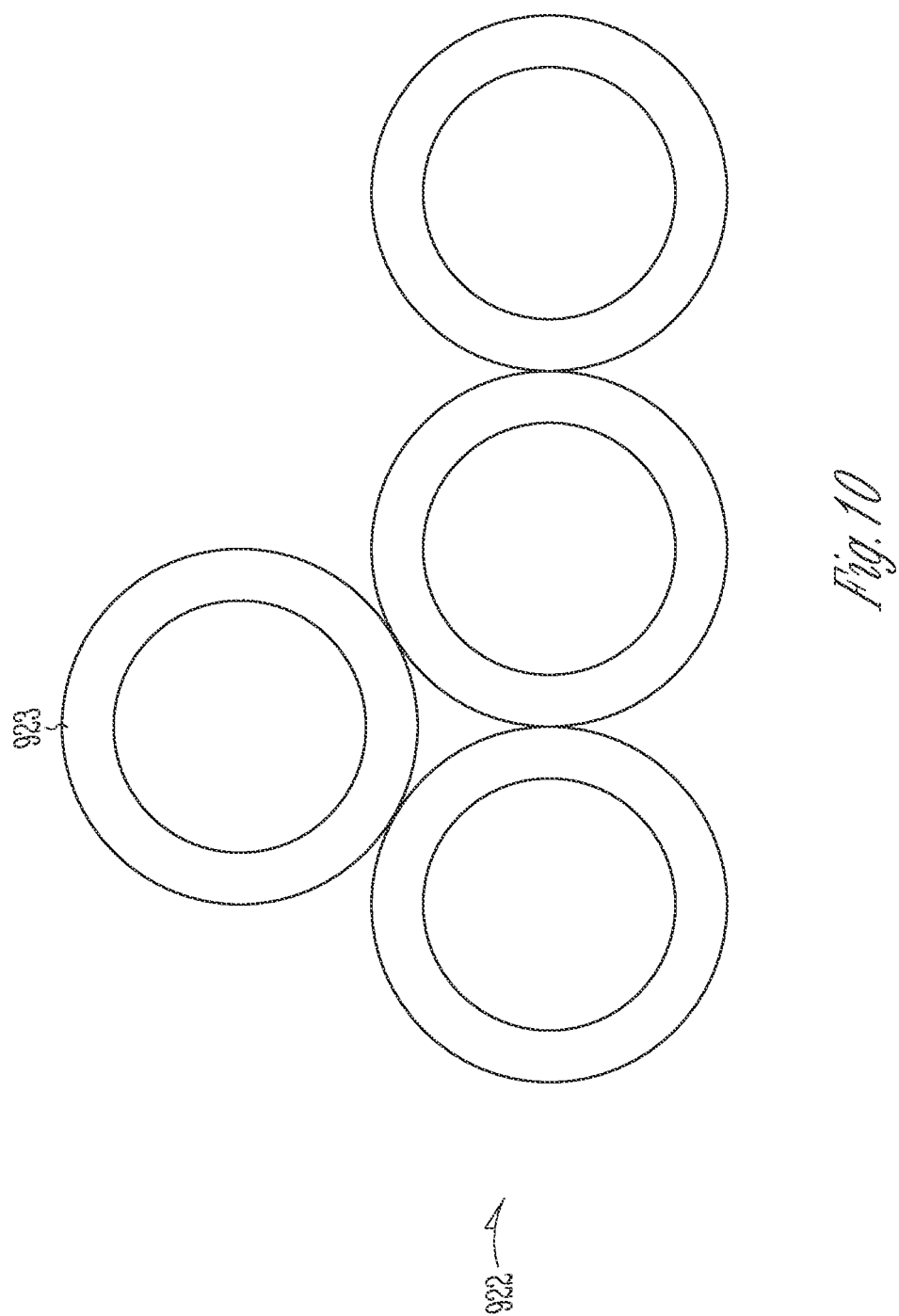

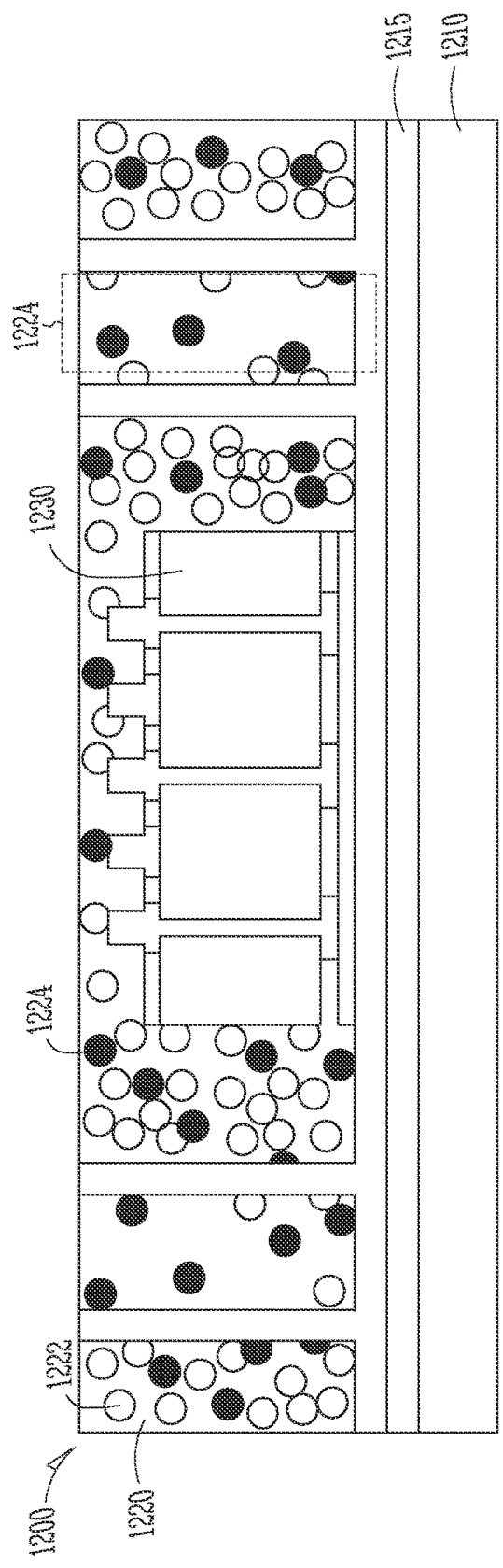
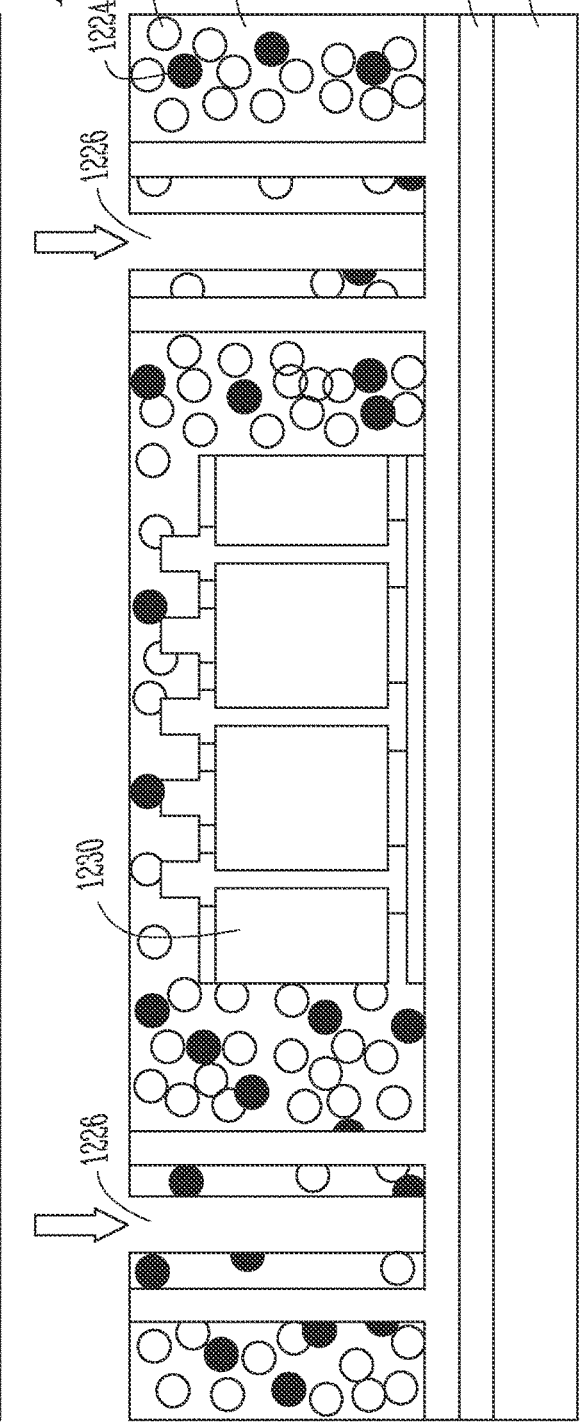

OMNI DIRECTIONAL INTERCONNECT WITH MAGNETIC FILLERS IN MOLD MATRIX

TECHNICAL FIELD

Embodiments described herein generally relate to semiconductor interconnect bridges, and specifically to methods of making interconnect bridges with magnetic filler particles.

BACKGROUND

In the semiconductor packaging industry, there is increasing demand for miniaturization of form factor and integration for high performance. It is desired to have packing methods and architectures that address these concerns, and other technical challenges.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4 illustrates a semiconductor interconnect including a magnetic filler particles, in an example.

FIGS. 7A-7B illustrate semiconductor interconnects including magnetic filler particles, in an example.

FIG. 10 illustrates magnetic filler particles with a coating, in an example.

FIGS. 12A-12B illustrate a method of making drilling or etching pathways in a semiconductor interconnect including magnetic filler particles, in an example.

DETAILED DESCRIPTION

Figure 1:
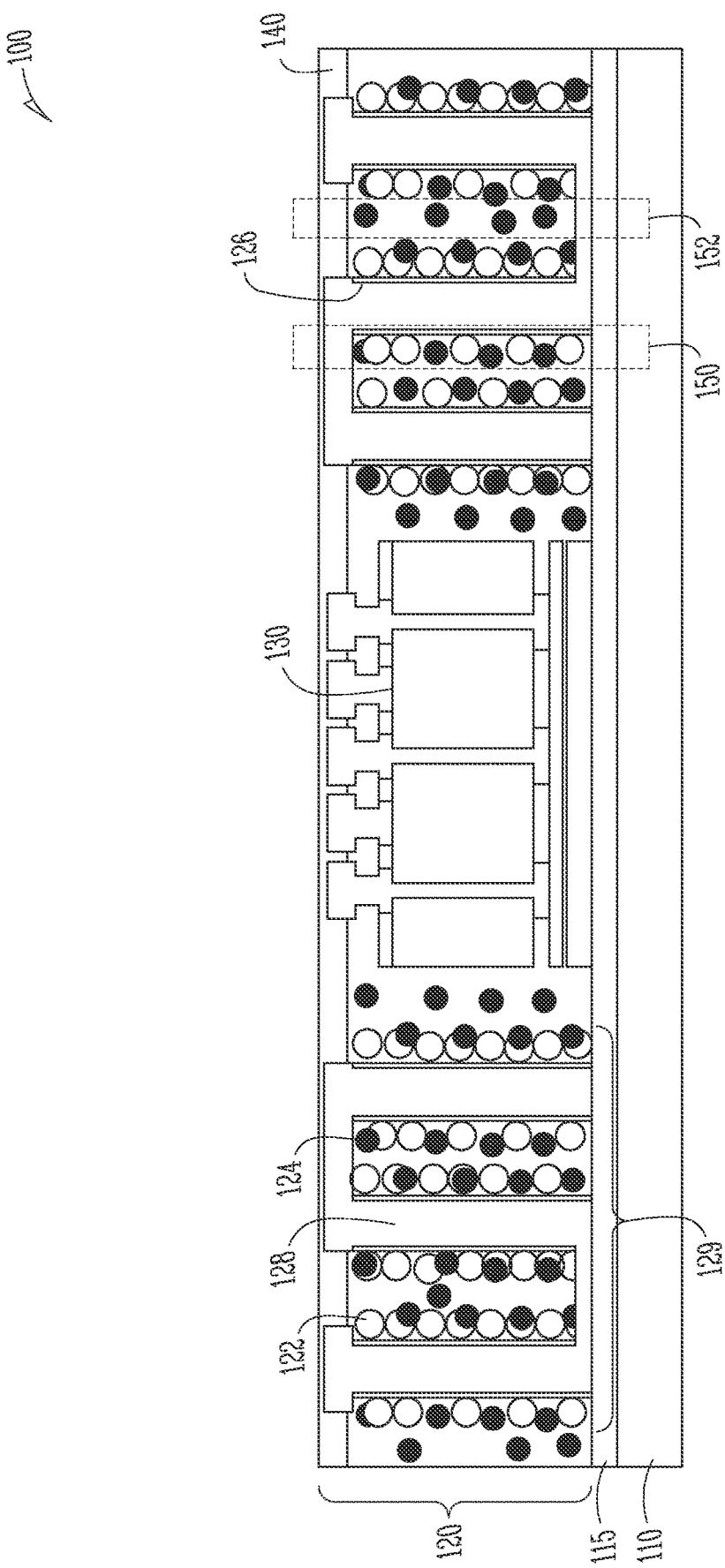
FIG. 1 illustrates a semiconductor interconnect incorporating self-assembled pillars using magnetic fillers in a mold matrix, in an example.

The following description and the drawings sufficiently illustrate specific embodiments to enable those skilled in the art to practice them, Other embodiments may incorporate structural, logical, electrical, process, and other changes. Portions and features of some embodiments may be included in, or substituted for, those of other embodiments. Embodiments set forth in the claims encompass all available equivalents of those claims.

Discussed are semiconductor packing architectures and methods of manufacturing that leverage self-assembling, magnetic filler particles in mold matrices to create complex architectures that are both small in form factor and can support high performance.

As the demand for smaller form factor semiconductor packaging and higher performance has increased, a number of complex packaging strategies have emerged, including, but not limited to, embedded multi-die interconnect bridges (EMIB), which enabled lower cost and simpler packaging for high density interconnects. Such bridges have allowed partitioning of chips, resulting in miniaturization without yield issues. However, current EMIB designs have a limit on the dies that can be connected due to bump thickness variation (BTV). Specifically, bump pitches at 25 microns or less, which are finer, are difficult to connect through or other conventional bridge technologies.

Discussed herein are omnidirectional interconnect (ODI) used in semiconductor packaging for interconnect bridges. Such ODIs can communicate horizontally with other dies, and vertically with larger through silicon vias (TSVs). ODI can leverage large vertical vias to allow power delivery to a top die directly from the package substrate. Moreover, ODI can allow for higher bandwidth and lower latency with the larger vias. Discussed herein, the assembly of interconnect bridges, such as these ODIs, can benefit from the use of magnetic filler particles in the mold matrix.

For example, a mold matrix with magnetic filler particles can be used for warpage reduction and enhanced power delivery. In some cases, the via can be formed through sacrificial pillars utilizing magnetic filler particles in the mold matrix. A self-assembled filler gradient in a mold matrix can be made with magnetic filler particles to reduce warpage. In some cases, a power delivery pillar can be self-assembled using magnetic filler particles in mold. Additionally, drilling or etching paths can be made through magnetically aligned via using the magnetic filler particles. Each of these concepts is discussed in more detail below with references to FIGS. 1-13D.

In an example, a semiconductor assembly can include a mold layer having a first side and a second side, the mold layer comprising a mold material, a first filler material dispersed in the mold material, and a second filler material dispersed in the mold material, wherein the second filler material includes magnetic particles, a die embedded in the mold layer, and one or more power delivery pillars extending in the mold layer from the first side to the second side.

In an example, a semiconductor assembly can include a mold layer having a first side and a second side. The mold layer can include a mold material, a first filler material dispersed in the mold material, and a second filler material dispersed in the mold material; wherein the second filler material includes magnetic particles. The assembly can further include a die embedded in the mold layer, one or more power delivery pillars extending in the mold layer from the first side to the second side, and a ferromagnetic layer plated on the one or more power delivery pillars, wherein the second filler material is more densely dispersed within the mold layer adjacent the one or more power delivery pillars.

In an example, a method of making a semiconductor assembly can include building power delivery pillars on a carrier material; plating a ferromagnetic material onto the power delivery pillars to create a plated layer; mounting a die on the carrier material; encapsulating the power delivery pillars and the die with a mold layer, the mold layer comprising a mold material, a first filler material, and a second filler material, wherein the second filler material comprises ferromagnetic particles; allowing the ferromagnetic particles to migrate towards the plated layer; and curing the mold layer.

In an example, a semiconductor assembly can include a mold layer having a first side and a second side, a die embedded in the mold layer; one or more power delivery pillars extending in the mold layer from the first side to the second side; one or more vias extending in the mold layer from the first side to the second side, each of the one or more vias filled with a filler material.

In an example, a method of making a semiconductor assembly can include building power delivery pillars on a carrier material, forming sacrificial pillars on the carrier material, mounting a die, encapsulating the power delivery pillars, the sacrificial pillars, and the die with a mold layer, forming vias by removing the sacrificial pillars, and filling the vias with a filler material.

In an example, a semiconductor assembly can include a mold layer having a first side and a second side, a die embedded in the mold layer, one or more power delivery pillars extending in the mold layer from the first side to the second side, one or more vias extending in the mold layer from the first side to the second side, each of the one or more vias filled with a filler material.

In an example, a method can include building power delivery pillars on a carrier material, forming sacrificial pillars on the carrier material, mounting a die, encapsulating the power delivery pillars, the sacrificial pillars, and the die with a mold layer, forming vias by removing the sacrificial pillars, and filling the vias with a filler material.

In an example, a semiconductor assembly can include a mold layer having a first side and a second side, the mold layer comprising: a mold material; a first filler material dispersed in the mold material; and a second filler material dispersed in the mold material; wherein the second filler material includes magnetic particles; a die embedded in the mold layer; one or more power delivery pillars extending in the mold layer from the first side to the second side; and wherein the second filler material is more densely dispersed within the mold layer along a gradient between the first side and the second side.

In an example, a method can include building power delivery pillars on a carrier material; mounting a die on the carrier material; encapsulating the power delivery pillars and the die with a mold layer, the mold layer comprising a mold material, a first filler material, and a second filler material, wherein the second filler material comprises ferromagnetic particles; creating a gradient of the second filler material within the mold layer by applying an external magnetic field; and curing the mold layer.

In an example, a semiconductor assembly can include a mold layer having a first side and a second side, the mold layer comprising: a mold material; a first filler material dispersed in the mold material; and a second filler material dispersed in the mold material; wherein the second filler material includes magnetic particles; a die embedded in the mold layer; and one or more power delivery pillars extending in the mold layer from the first side to the second side, the one or more power delivery pillars comprising the second filler material.

In an example, a method can include mounting a die on a carrier material; encapsulating the die with a mold layer, the mold layer comprising a mold material, a first filler material, and a second filler material, wherein the second filler material comprises ferromagnetic particles; creating one or more power delivery pillars with the second filler material by applying an external magnetic field; and curing the mold layer.

In an example, a semiconductor assembly can include a mold layer having a first side and a second side, the mold layer comprising: a mold material; a first filler material dispersed in the mold material; a second filler material dispersed in the mold material; wherein the second filler material includes magnetic particles, wherein the second filler material is heterogeneously dispersed within the mold layer; and one or more low filler areas with a lesser density of the second filler material compared to one or more high filler areas; a die embedded in the mold layer; one or more power delivery pillars extending in the mold layer from the first side to the second side; and one or more vias extending in the mold layer from the first side to the second side, the one or more vias located in the one or more low filler areas.

In an example, a method can include building power delivery pillars on a carrier material; mounting a die; encapsulating the power delivery pillars and the die with a mold layer, the mold layer comprising a mold material, a first filler material dispersed in the mold material, and a second filler material dispersed in the mold material, wherein the second filler material includes magnetic particles; applying an external magnetic field to induce heterogeneous migration of the second filler material and create high filler areas and low filler areas; and making vias in the low filler areas.

FIGS. 1 to 3F relate to incorporating magnetic particle fillers within a mold matrix of an ODI patch to reduce warpage. For example, in this application, magnetic particle fillers are incorporated into the mold matrix to enable a flatter patch, such as for thermo-compressed bonding (TCB). This can also allow for an increased electrical performance of the pillars in the ODI, allowing for more efficient power delivery.

Previous methods have used techniques to optimize the mold matrix material and fillers to find a balance between coefficient of thermal expansion (GTE) and potential warpage of the package. But these previous methods had the disadvantage of being a global optimization, without the ability to tailor specific, localized control.

These challenges can be avoided with the use of magnetic filler particles in the mold matrix. The methods and packages discussed with reference to FIGS. 1 to 3F depict a method incorporating magnetic particles as a secondary filler in the mold matrix, creation of pillar routing within the mold matrix, and magnetic particle self-assembly around the pillars to create a high filler content area. This can increase permeability in the mold matrix.

This methodology can allow for an array with different areas of high CTE and low CTE. Such an array can increase adhesion between the pillars and the mold matrix, and decrease warpage. Concurrently, the magnetic filler particles around the pillars can enhance power delivery performance. An example of such a package is shown in FIG. 1

FIG. 1 illustrates a semiconductor interconnect assembly 100 incorporating self-assembled pillars using magnetic fillers in a mold matrix. The interconnect assembly 100 can include a carrier 110, intermediate layer 115, mold layer 120 with magnetic filler particles 122 and secondary filler particles 124, a ferromagnetic layer 126, pillars 128, a die 130, and a redistribution layer (RDL) 140. In some cases, the ferromagnetic layer 126 can be nickel.

The carrier 110 can be, for example, a glass carrier for production of the assembly 100. The carrier 110 can host the other components, during assembly. The carrier 110 can be configured for easy removal when the assembly 100 is built, and can be removed, for example, by an intermediate layer. In some cases, a first side of the assembly 100 can be built with a first carrier 110, and subsequently a second side of the assembly 100 can be built with a second carrier on the opposing side.

An intermediate layer 115 can reside on the carrier 110. Such an intermediate layer can be, for example, a glass substrate, silicon substrate, an adhesive layer such as for hosting the rest of the assembly 100. In some cases, the intermediate layer 115 can be one or more redistribution layers, such as layers of an organic material and a conductor.

The mold layer 120 is built up from the intermediate layer 115 on the carrier 110. The mold layer can be, for example, a polymer layer surrounding the other components on the intermediate layer 115. In some cases, the mold layer 120 can be an epoxy. The mold layer 120 can include an array of filler particles, including the magnetic filler particles 122 and the secondary filler particles 124.

The interconnect assembly 100 can, in some cases, include additional dies on top. For example, one or more active dies, such as memory, logic, or other dies, can be situated on top of the RDL 140 and interconnected through the assembly 100 and the bridge die 130. The dies can be interconnected by one or more layers of conductive trace, vias, or other dies.

The magnetic filler particles 122 can be ferromagnetic or magnetic particles used for self-assembly of the pillars 128. "Magnetic" can include materials that are capable of being attracted by or acquiring the properties of a magnet. "Ferromagnetic" can include materials that have a high susceptibility to magnetism, depending on the application of a magnetic field. As used herein, "magnetic" and "ferromagnetic" are interchangeable.

In an example, the magnetic filler particles 122 can be nickel, cobalt iron, nickel iron, or other appropriate species. The ferromagnetic particles can have an average diameter of about less than one micron each. The magnetic filler particles 122 can move around before curing inside the mold layer 120 matrix to form aligned pillars under a magnetic field within a reasonable time. The secondary filler particles 124 can be non-magnetic filler particles.

The ferromagnetic layer 126 resides on the pillars 128. The pillars 128 can extend through the mold layer 120 from the intermediate layer 115 towards the redistribution layer 140. Each of the pillars 128 can be at least partially covered in the thin ferromagnetic layer 126. The ferromagnetic layer 126 can be applied, for example, by plating, chemical deposition, or other deposition methods. In some cases, the pillars 128 can be used for power delivery in the assembly 100. In some cases, the pillars 128 can be used as inductors or for other uses, such as data transmission. For example, seen in FIG. 1, the pillars 128 can be an inductor configuration 129.

In the assembly 100, instead of arranging the magnetic filler particles 122 by an external magnetic field, the magnetic filler particles 122 will be attracted by the ferromagnetic layer 126 on the pillars 128. Thus, the magnetic filler particles 122 will self-assemble around the pillars 128 due to localized attraction. This will naturally unequal distributions of particles, which can provide useful anisotropic properties, for example, the unequal distributions of particles can create high CTE areas 150 and low CTE areas 152.

The die 130 can include an interconnect bridge. In some cases, the die 130 can be a bridge for use with an active semiconductor device such as transistors, logic capability dies, memory dies, or combinations thereof. In one example, the die 130 can include an interconnect bridge. The interconnect bridge can be silicon, glass, organic, or other suitable bridge material. In one example, the die 130 can include one or more through vias, such as shown in FIG. 1, In some cases, the die 130 can transmit signals or power between additional dies using a top surface of the die 130 and through the die 130, allowing for connection, signal transmission, and power movement in both longitudinal and vertical directions.

The RDL 140 can be one or more layers, such as of a dielectric material, with one or more connections therethrough. Connections can include, for example, traces. The RDL 140 can help direct and connect the die 130. The RDL 140 can additionally be used to create connections between other dies, such as processor, memory, controller, and other types of dies, such as active dies, attached above the RDL 140.

In FIG. 1, a general overview of a finished mold architecture using self-assembling magnetic filler particles 122 around pillars 128 is shown. This can allow for low and high CTE regions and inductor-like structure to enhance the current carrying capacity of the assembly 100.

In particular, as shown in FIG. 1, the added magnetic filler particles 122 can be self-assembled around the ferromagnetic layer 126 on the pillars 128 to form a higher filler content area. In parallel, the standard, non-magnetic, regular fillers 124 can remain in their position forming a low filler content area. Thus, a relatively low CTE area 152 and a relatively high CTE 150 can be formed within the mold layer 120. In some cases, the relatively low CTE area 152 can be formed by the relatively high CTE area 154 (e.g., a low modulus area) for stress prevention. A balance of low and high CTE areas across the assembly 100 can help to mitigate residual stress generated during the thermal curing of the mold layer 120 (e.g., due to its shrinkage). Such a balance of low and high CTE areas can mitigate stresses that may occur during use of a device due to heating and CTE mismatch.

In addition to filler content variation, when the magnetic filler particles 122 s are self-assembled around the pillars 128 routing around the mold layer 120, an inductor-based current carrying capability enhancement can be achieved. The magnetic filler rich resin around the pillars 128 can enhance the inductance. Thus, as inductors are built into the RDLs 140 of the assembly 100, the inductors can reside very close to the die 130, providing much higher impact than the case where they would be in a core package.

Figure 2B:
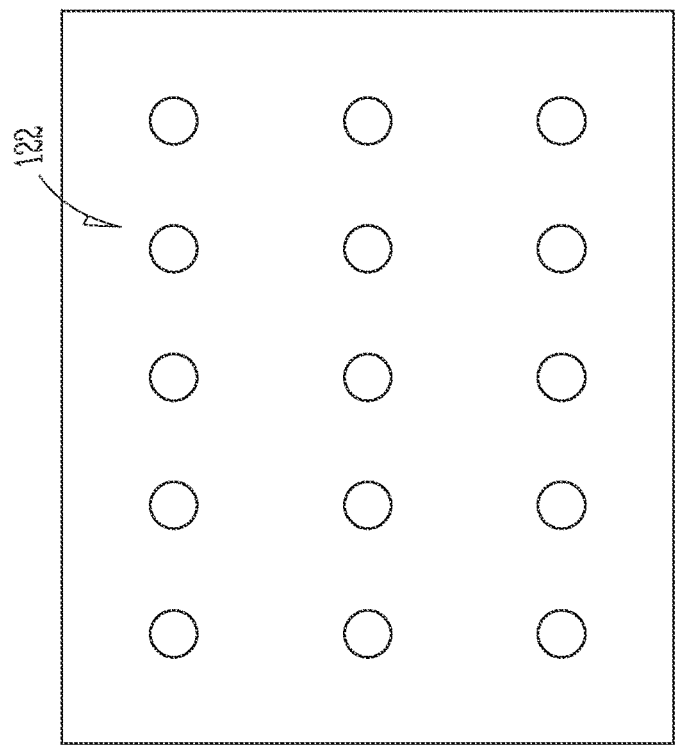
FIGS. 2A-2B illustrate magnetic field control of self-assembling pillars using magnetic filler particles in a mold matrix, in an example.
Figure 2A:
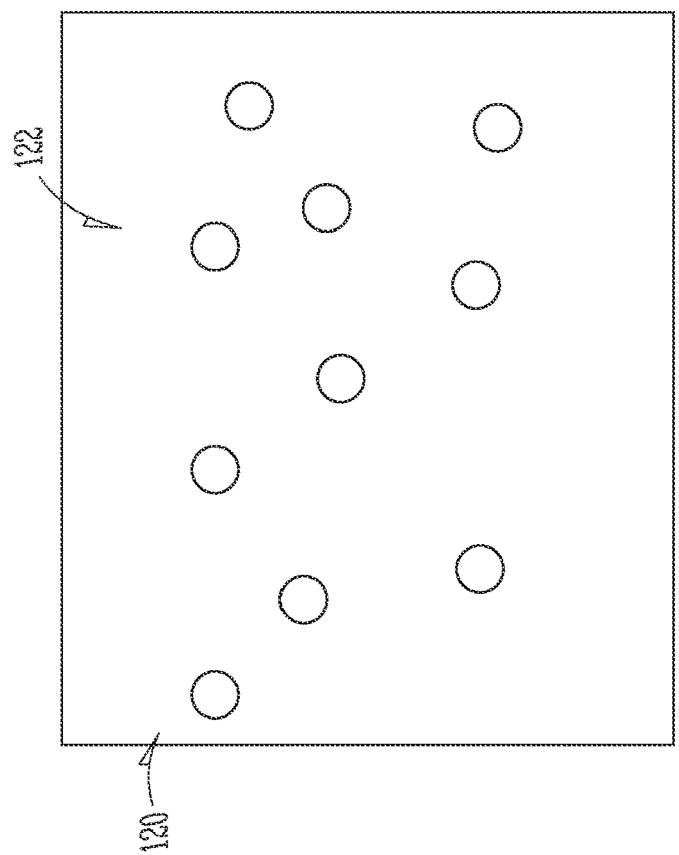

FIGS. 2A-2B illustrate magnetic field control of self-assembling magnetic filler particles 122 in a mold layer 120, in an example. In FIG. 2A, no magnetic field is applied, and the magnetic filler particles 122 are random. In FIG. 2B, a magnetic field is applied, organizing the magnetic filler particles 122.

FIGS. 3A-3F illustrate a method of making the semiconductor assembly 100 by incorporating magnetic filler particles 122 in the mold 120 to induce self-assembling of magnetic filler particles 122 around the pillars 128.

Figure 3A:
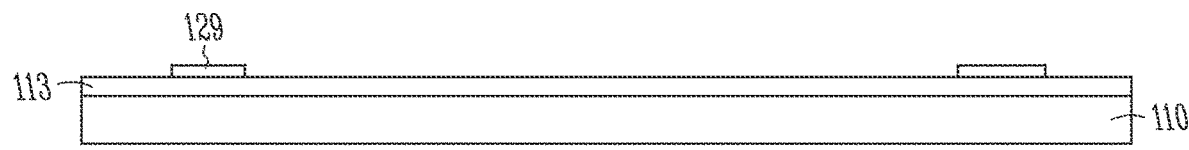
FIGS. 3A-3F illustrate a method of making a semiconductor interconnect incorporating magnetic filler particles in a mold material, in an example.
Figure 3B:
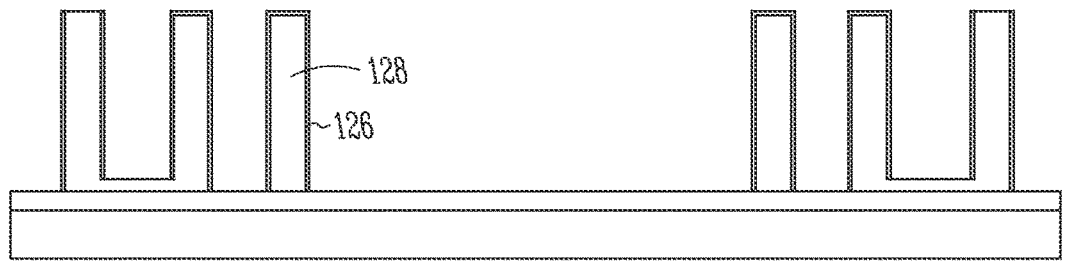

In FIG. 3A, routing 129 is applied to the intermediate layer 115 and the glass carrier 110. The routing 129 can be, for example, copper, aluminum, an alloy, or other appropriate conductive material. Next, in FIG. 313, the full pillars 128 are built up from the routing 129. The pillars 128 can correspond to the routing; in an example, copper routing and copper pillars can be built. The pillars 128 can be, for example, copper, aluminum, an allow, or other appropriate conductive material. The nickel can be plated (or otherwise deposited) onto the pillars 128 to create the ferromagnetic layer 126.

Figure 3C:
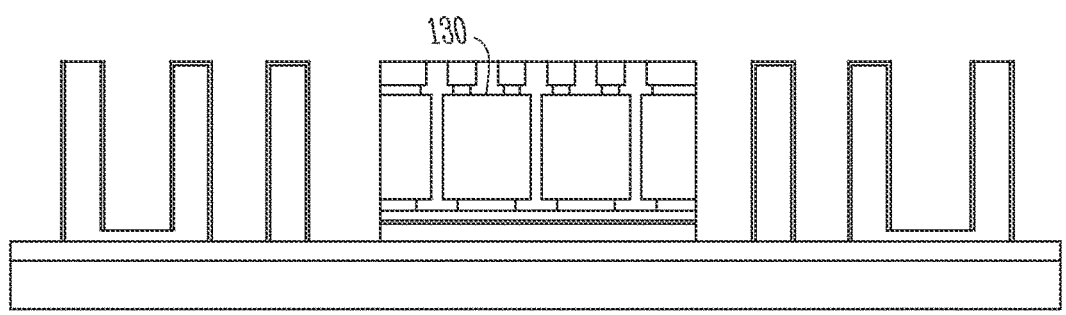
Figure 3D:
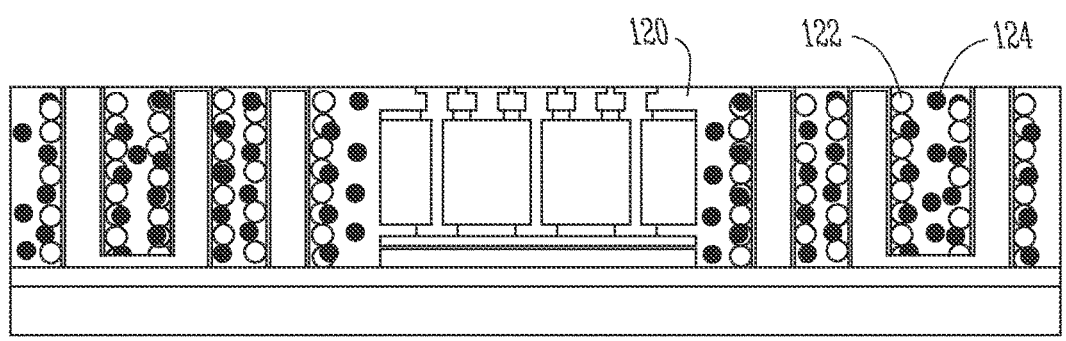

At FIG. 3C, the embedded dies can be mounted, such as the die 130. Molding can then be done over the pillars 128, die 130, and other components (FIG. 3D) to create the mold layer 120. The mold layer 120 can include both magnetic filler particles 122 and secondary filler particles 124. This can encapsulate the existing features in the assembly 100.

Figure 3E:
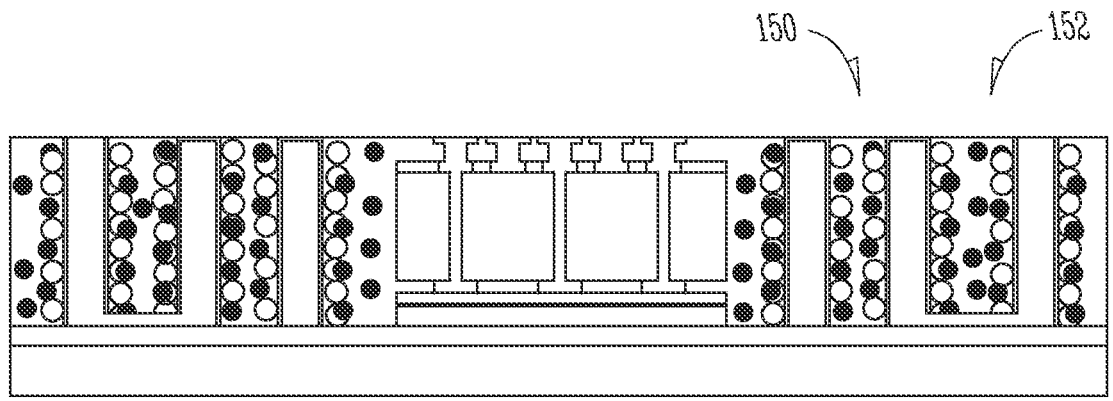
Figure 3F:
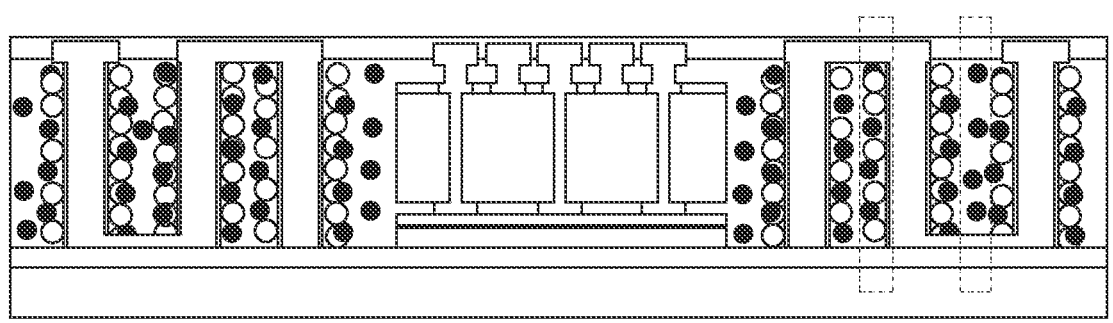

During molding, the magnetic filler particles 122 can self-assemble around the pillars 128 due to attraction to the ferromagnetic layer 126 (e.g., nickel) (FIG. 3E). The ferromagnetic layer 126 will attract the magnetic filler particles 122 within the mold layer 120. Subsequently, at FIG. 3F, the RDL 140 can be patterned, and connections can be made among the pillars 128 in the RDL 140.

FIGS. 4 to 6F relate to creation of vias in a mold matrix using sacrificial pillars for localized modification in an ODI. Here, a heterogenous mold layer can be made using mold materials including a polymer mold matrix and additional functional mold materials, such as magnetic filler particles. In this case, via openings can be created in the mold matrix, and subsequently filled with a filler material to improve local mechanical, electrical, and thermal performance. For example, the filler material may exhibit a high thermal conductivity to achieve better thermal conductivity in hot zones. In some cases, a second mold material with different fillers can be used to modify local stress for better mechanical stability.

The methods for production of a heterogeneous mold matrix can be accomplished, for example, by patterning or dispensing sacrificial pillars before a panel level molding process, by removing the sacrificial pillars to create via openings after the panel level molding process, and filling the via openings with a different filler material (e.g., with magnetic filler particles) to create localized modifications. This can allow for localized modifications of a mold matrix or mold layer, such as to improve warpage, thermal, and mechanical properties of the package as a whole.

FIG. 4 illustrates a semiconductor assembly 400 including a heterogeneous mold layer, in an example. The assembly 400 can include a carrier material 410, an intermediate layer 415, a mold layer 420, filler material 422, secondary filler particles 424, vias 426, pillars 428, die 430, and RDL.

The carrier material 410 can be, for example, a glass carrier for production of the assembly 400. The carrier 410 can host the other components during assembly. The carrier 410 can be configured for easy removal when the assembly 400 is built.

An intermediate layer 415 can reside on the carrier 410. Such an intermediate layer can be, for example, a glass substrate, silicon substrate, an adhesive layer such as for hosting the rest of the assembly 400. In some cases, the intermediate layer 415 can be one or more redistribution layers, such as layers of an organic material and a conductor.

The mold layer 420 is built up from the intermediate layer 415 on the carrier 410. The mold layer can be, for example, a polymer layer surrounding the other components on the intermediate layer 415. In some cases, the mold layer 420 can be an epoxy. The mold layer 420 can include an array the secondary filler particles 424.

The mold layer 420 here can be interspersed with portions of the filler material 422. The filler material 422 can reside, for example, within vias 426 made in the mold layer 420 with sacrificial pillars. The filler material 422 can serve a variety of thermal, mechanical, or other purposes within the mold layer 420, and allow for a heterogeneous mold layer on the assembly 400.

The filler material 422 can be, for example, be used to provide additional localized modification to the mold layer 420. For example, the filler material 422 can be a thermally conductive material which provides thermal dissipation, such as a highly conductive metal (e.g., silver, aluminum, or others), carbon based fillers (e.g., graphite graphene, diamond), or a highly conductive ceramics (e.g., BN or AN). In some cases, the filler material 422 can include a different filler, such as a magnetic filler material. In some cases, a different filler can be used in the filler material 422, which would not otherwise be used globally in the assembly 400 due to integration challenges. In some cases, use of a secondary or different filler in the filler material 422 can provide additional mechanical benefit. Other example filler materials 422 can include, for example, liquid metal, stress absorbers, dielectric materials, magnetic materials, or others.

The vias 426 can be formed within the mold layer 420 and filled with the filler material 422. The vias 426 can be formed, for example, as shown and described with reference to FIGS. 5A-6F below. In some cases, sacrificial pillars can be used to create the vias 426. Such a sacrificial pillar can be made, for example, with a sacrificial material, such as a photoresist material, removable by stripping chemistry. In some cases, the sacrificial material can be a thermally decomposable material removed by thermal degradation. In some cases, the sacrificial material can include a high dry etch rate material, such as removable by plasma dry etch. In some cases, the sacrificial material can include sacrificial pillars that can be wet etched, such as copper pillars. In some cases, the pillars can be aluminum, and allow, or other metallic or conductive material suitable for such wet etching.

By contrast, the pillars 428 can be, for example, copper pillars extending through the mold layer 420 for a power supply, for transmission of data, or for other use.

The die 430 can be a bridge die for connecting one or more active dies in a semiconductor device, or in some cases the die 430 can be an active die. The die 430 can include an interconnect bridge. In some cases, the die 430 can be a bridge for use with an active semiconductor device such as transistors, logic capability dies, memory dies, or combinations thereof. In one example, the die 430 can include an interconnect bridge. The interconnect bridge can be silicon, glass, organic, or other suitable bridge material. In one example, the die 430 can include one or more through vias, such as shown in FIG. 4. In some cases, the die 430 can transmit signals or power between additional dies using a top surface of the die 430 and through the die 430, allowing for connection, signal transmission, and power movement in both longitudinal and vertical directions.

The RDL can be one or more layers, such as of a dielectric material, with one or more connections therethrough. Connections can include, for example, traces. The RDL can help direct and connect the die 430.

The heterogenous mold layer 420 of the assembly 400 can include a filler material 422 filling in a mold architecture. The via 426 for filling can be created through the use of a sacrificial material. This contrasts with homogeneous mold systems and allows localized properties in the system 400.

Figure 5A:
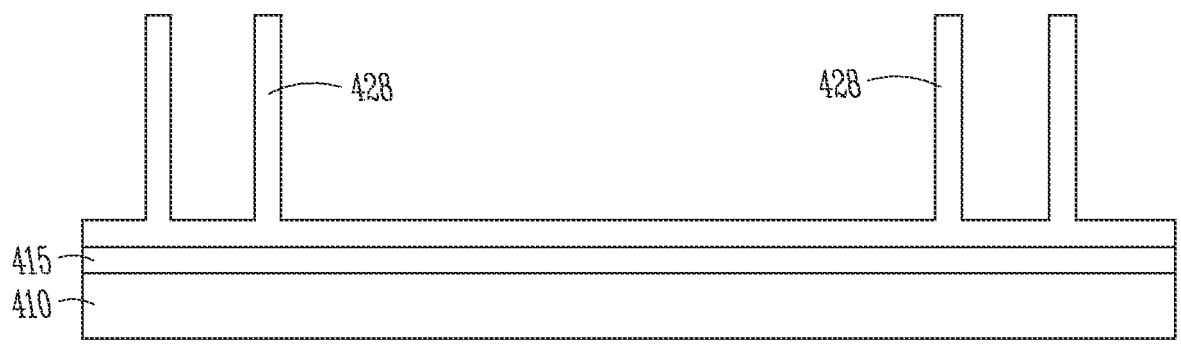
FIGS. 5A-5F illustrate a method of making via in a mold matrix by sacrificial pillar using magnetic filler particles, in an example.

FIGS. 5A-5F illustrate a method of making via in a semiconductor assembly 400 by sacrificial pillar using magnetic filler particles, in an example. The assembly 400 can be made, for example, by forming pillars 428 on the carrier 410 (FIG. 5A). These regular pillars 428 can be, for example, copper pillars for later use in power movement across the assembly 400.

Figure 5B:
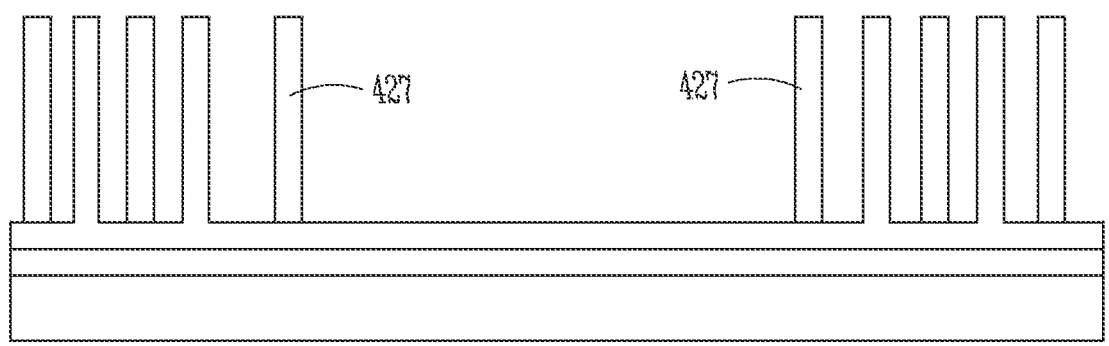
Figure 5C:
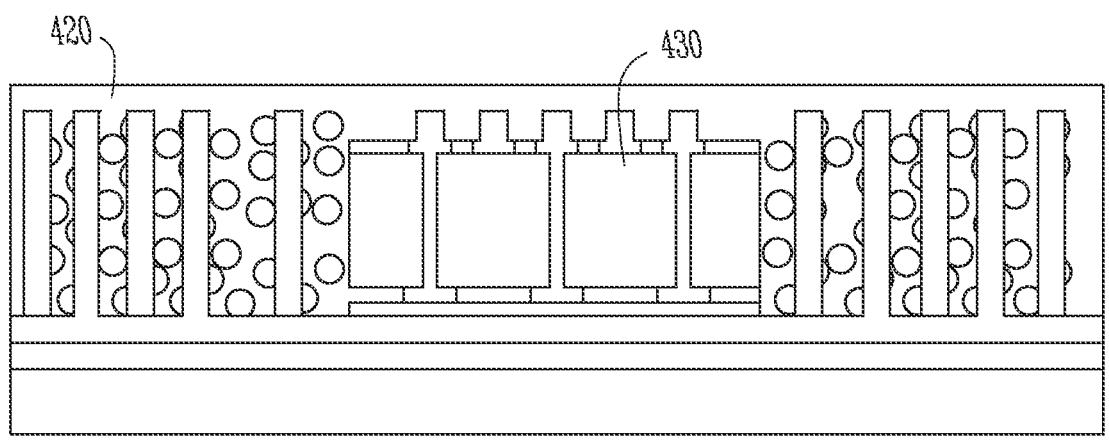

Next, sacrificial pillars 427 can be formed as precursors to the vias 426 (FIG. 5B). These sacrificial pillars 427 can be patterned or dispensed where desired on the carrier 410. For example, the sacrificial pillars 427 can be formed in between the regular pillars 428. The die 430 can then be mounted (FIG. 5C), and a regular mold material for the mold layer 420 can be molded over the existing components, including the regular pillars 428, the sacrificial pillars 427, and the die 430.

Figure 5D:
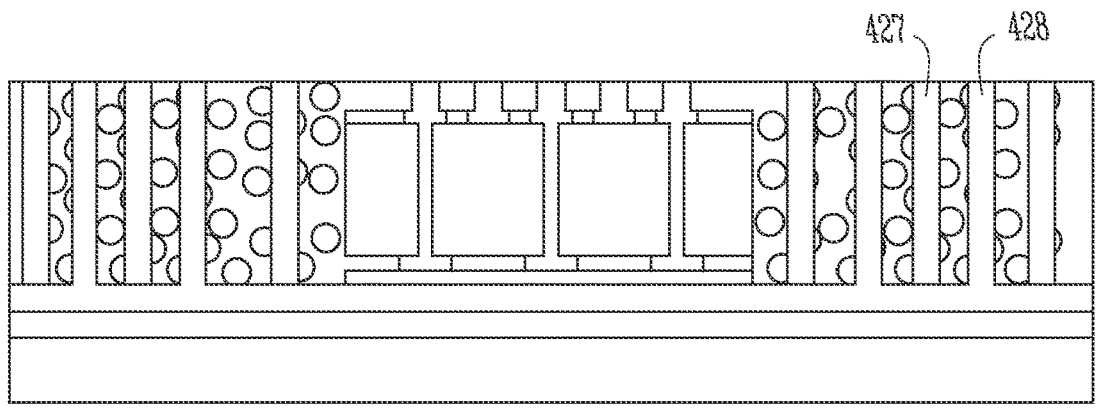
Figure 5E:
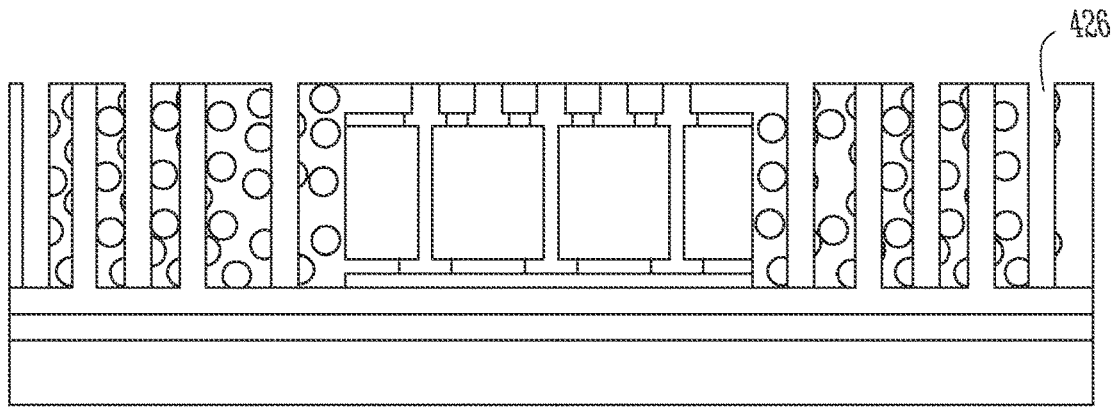

The mold layer 420 can be ground down to reveal both the regular pillars 428 and the sacrificial pillars 427 (FIG. 5D). The sacrificial pillars 427 can then be removed (FIG. 5E). Depending on the material type of the sacrificial pillars 427, the sacrificial pillars 427 and be removed with chemical stripping thermal decomposition, or other removal techniques. This can reveal the vias 426.

Figure 5F:
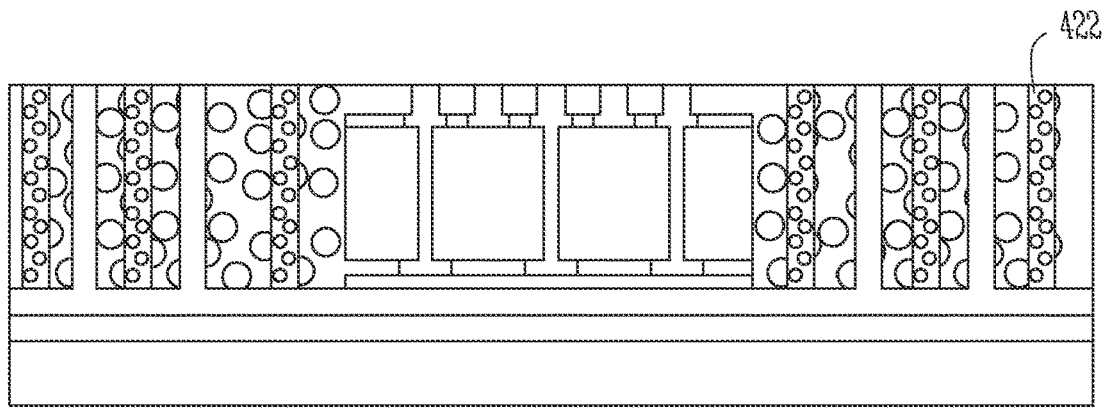

The vias 426 can then be filled with the filler material 422 (FIG. 5F). The filler material 422 can be filled into the vias 426 based on the material type, such as by stencil printing, jetting, molding or other methods appropriate based on the via size.

FIGS. 6A-6E illustrate a method of making via in a semiconductor assembly 400 by sacrificial pillar using magnetic filler particles, in an example. In some cases, the sacrificial pillars 427 can be patterned and etched using copper etching chemistry.

Figure 6A:
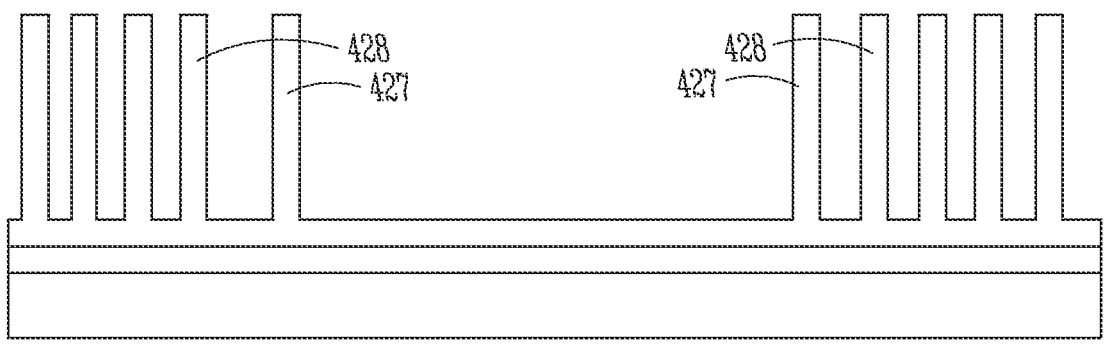
FIGS. 6A-6E illustrate a method of making via in a mold matrix by sacrificial pillar using magnetic filler particles, in an example.
Figure 6B:
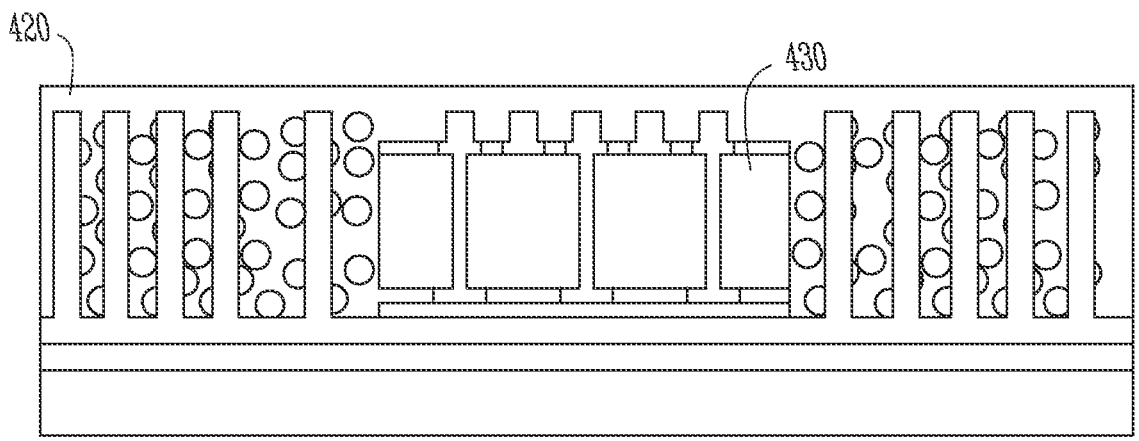
Figure 6C:
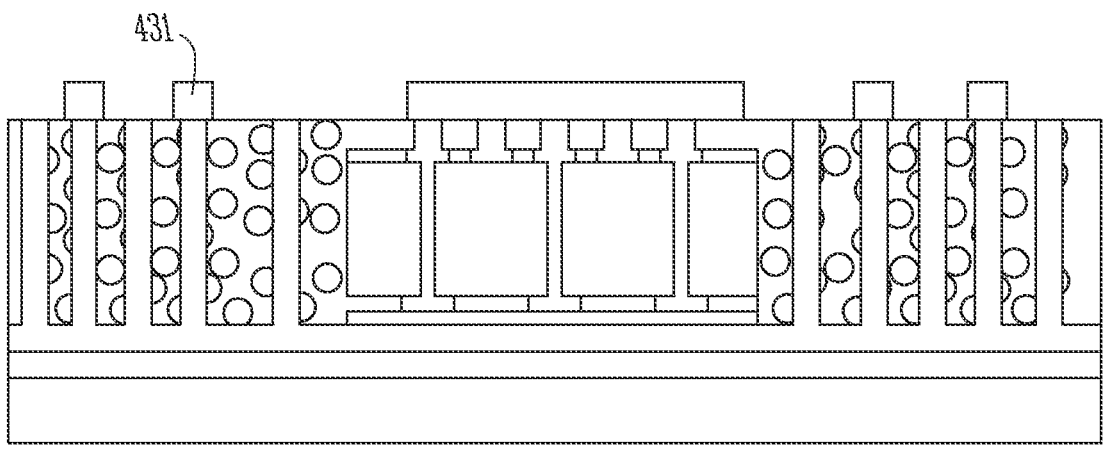

In this case, the sacrificial pillars 427 can be formed simultaneously with the regular pillars 428 (FIG. 6A). Both the sacrificial pillars 427 and the regular pillars 428 can be copper pillars. In some cases, the pillars 427, 428, can be aluminum, an allow, or a different material. Then, the die 430 can be mounted (FIG. 6B) and the mold layer 420 can be applied over the other components (FIG. 6B). The sacrificial pillars 427 and the regular pillars 428 can then be revealed, such as through grinding down the mold layer 420 (FIG. 6C). Resist patterning can be done on the regular pillars 428 to protect them during later etching (FIG. 6C).

Figure 6D:
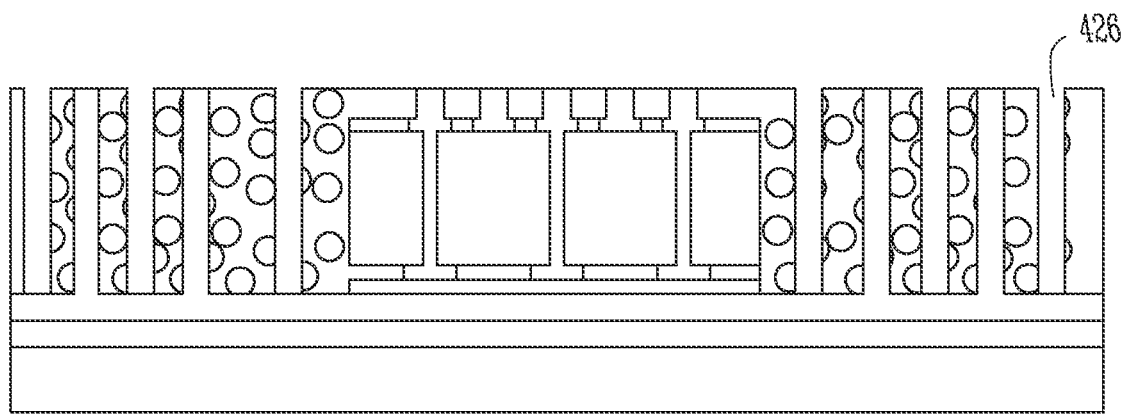
Figure 6E:
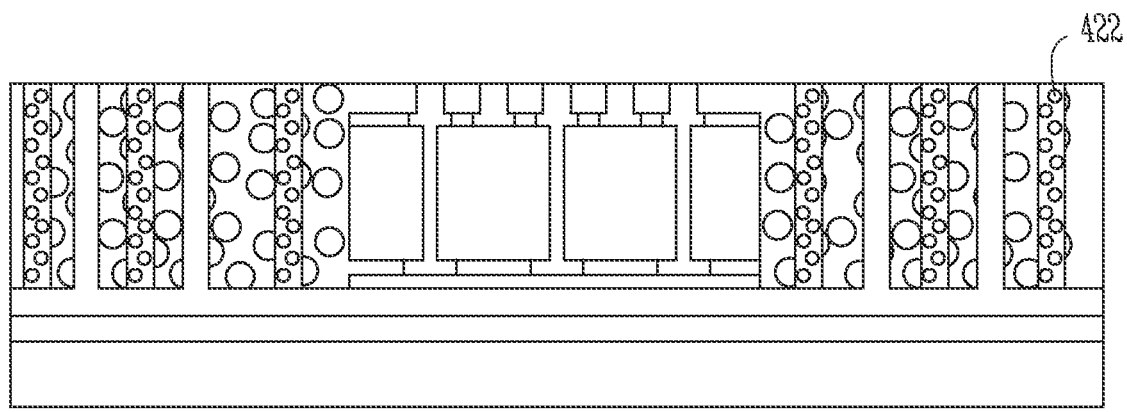

An etch mask 431 can be used to protect the regular pillars 428. The sacrificial pillars 427 can then be etched, such as using wet etching, to create the vias 426 (FIG. 6D). The resist patterning can protect the regular pillars 428 during this step. Finally, the vias 426 can be filled in with the filler material 422 (FIG. 6E).

FIGS. 7A to 8D relate to an ODI assembly with a self-assembling filler gradient in the mold layer. For example, incorporation of magnetic filler particles as a secondary filler can help reduce warpage in a semiconductor assembly package. Specifically, the magnetic filler particles can be manipulated within the mold layer to enable a concentrated particle regime at or near a surface of the mold layer, such as at a top or bottom of the assembly. Such a gradient can be self-assembling during manufacturing. This can allow for a corresponding CTE gradient in the mole layer to reduce assembly warpage. Additionally, where a high CTE dielectric is patterned on the mold layer with a controlled lower filler content, a smaller CTE mismatch at the interface of the dielectric and the mold layer can also reduce delamination risks during thermal cycling of the assembly.

As discussed above with reference to FIG. 1, other methods of producing low CTE mold materials generally rely on global approaches. But a global low CTE material can sometimes require higher filler material content or size, and can have a high modulus, resulting in high package stress.

The architecture and methods discussed here can include creating a CTE gradient in a mold layer by incorporating magnetic filler particles into a mold layer and building magnetic field producing components into a mold compression chamber to drive the magnetic filler particles into a self-assembled gradient, FIGS. 7A-7B illustrate a semiconductor assembly 700 including magnetic filler particles in a self-assembled gradient, in an example. The interconnect assembly 700 can include a carrier 710, intermediate layer 715, mold layer 720 with magnetic filler particles 722 and secondary filler particles 724, filler gradient 726, CTE gradient 727 copper pillars 728, a die 730, and a redistribution layer (RDL) 740. Plates 750 can be used during manufacturing to induce the gradients 726, 727.

The carrier 710 can be, for example, a glass carrier for production of the assembly 700. The carrier 710 can host the other components during assembly.

An intermediate layer 715 can reside on the carrier 710. Such an intermediate layer can be, for example, a glass substrate, silicon substrate, an adhesive layer such as for hosting the rest of the assembly 700. In some cases, the intermediate layer 715 can be one or more redistribution layers, such as layers of an organic material and a conductor.

The mold layer 720 is built up from the intermediate layer 715 on the carrier 710. The mold layer can be, for example, a polymer layer surrounding the other components on the intermediate layer 715. In some cases, the mold layer 720 can be an epoxy. The mold layer 720 can include an array of filler particles, including the magnetic filler particles 722 and the secondary filler particles 724. Within the mold layer 720, the magnetic filler particles 722 can be in a gradient from one surface to the other of the mold layer 720.

The magnetic filler particles 722 can be ferromagnetic particles used for self-assembly of the gradient 726. In an example, the magnetic filler particles 722 can be nickel, cobalt iron, nickel iron, or other appropriate species. The ferromagnetic particles can have an average diameter of about less than one micron each.

For some cases where magnetic type materials are not compatible with upstream processes (e.g., exposed magnetic particles on surface of mold layer 720), a shell can be formed around the magnetic filler particles 722. For example, such a shell can include SiN, SiOx, or other polymer material. When ferromagnetic particles are surrounded by epoxy material, their outer surfaces can be oxidized to form a non-conductive shell, which decreases shorting risk. An example view of magnetic filler particles 922 with a shell 923 are shown in FIG. 10.

The magnetic filler particles 722 can move around inside the mold layer 720 matrix to form the gradient 726 under a magnetic field induced by the plates 750 within a reasonable time. This can be accomplished, for example, under a parallel magnetic field within a short time. Here, the magnetic filler particles 722 can be attracted to move towards one direction to form the concentration gradient 726. Later, after the mold material is cured, the magnetic filler particles 722 locations can be locked and not move again after the parallel magnetic field is turned off. The secondary filler particles 724 can be non-magnetic filler particles that do not migrate into a gradient.

The copper pillars 728 can extend through the mold layer 720 from the intermediate layer 715 towards the redistribution layer 740. The copper pillars 728 can be used for power delivery in the assembly 700, for data transmission through the assembly 700, or for induction.

The die 730 can include an interconnect bridge. In some cases, the die 730 can be a bridge for use with an active semiconductor device such as transistors, logic capability dies, memory dies, or combinations thereof. In one example, the die 730 can include an interconnect bridge. The interconnect bridge can be silicon, glass, organic, or other suitable bridge material. In one example, the die 730 can include one or more through vias, such as shown in FIG. 7. In some cases, the die 730 can transmit signals or power between additional dies using a top surface of the die 730 and through the die 730, allowing for connection, signal transmission, and power movement in both longitudinal and vertical directions.

The RDL can be one or more layers, such as of a dielectric material, with one or more connections therethrough. Connections can include, for example, traces. The RDL can help direct and connect the die 730.

The mold layer 720 of the assembly 700 can have a gradient 726 of the magnetic filler particles 722 that is either denser near a top surface of the mold layer 720 (FIG. 7A) or denser near a bottom surface of the mold layer 720 (FIG. 7B). Such a gradient can be induced by plates 750, which can provide a magnetic field during creation of the assembly 700, such as in a compression chamber during manufacture. In the example of FIG. 7A, the gradient 726 can reduce convex warpage. In contrast, the gradient 726 shown in FIG. 713 can reduce concave warpage.

Figure 8A:
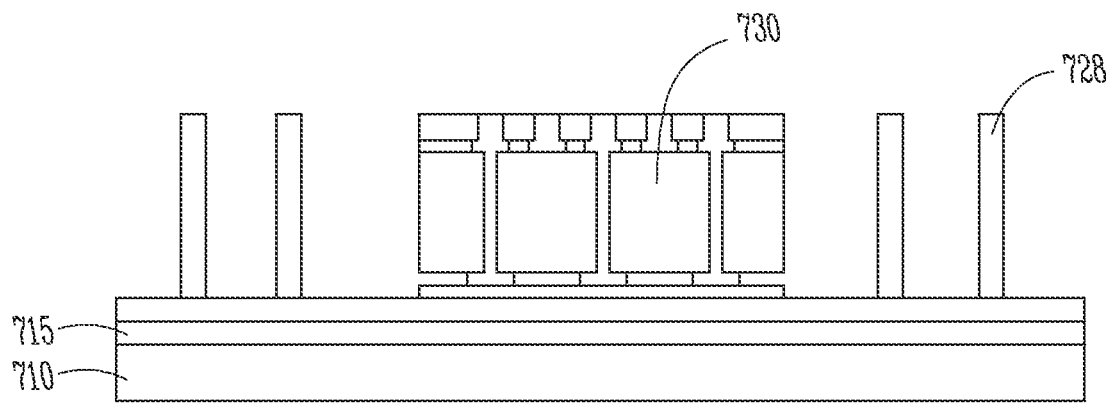
FIGS. 8A-8D illustrate a method of making a semiconductor interconnect with reduced warpage, using magnetic filler particles, in an example.
Figure 8B:
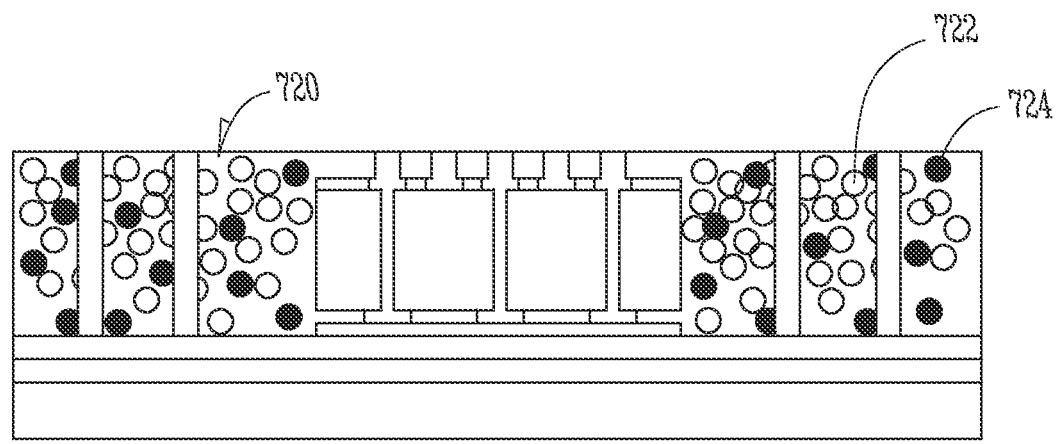

FIGS. 8A-8D illustrate a method of making a semiconductor assembly 700 with reduced warpage, using magnetic filler particles, in an example. The assembly 700 can be formed, for example, by forming tall copper pillars 728 on the carrier 710, and attaching the die 730 (FIG. 8A). Then, the mold layer 720 can be created over the other components (FIG. 8B). The mold layer 720 can include the magnetic filler particles 722.

Figure 8C:
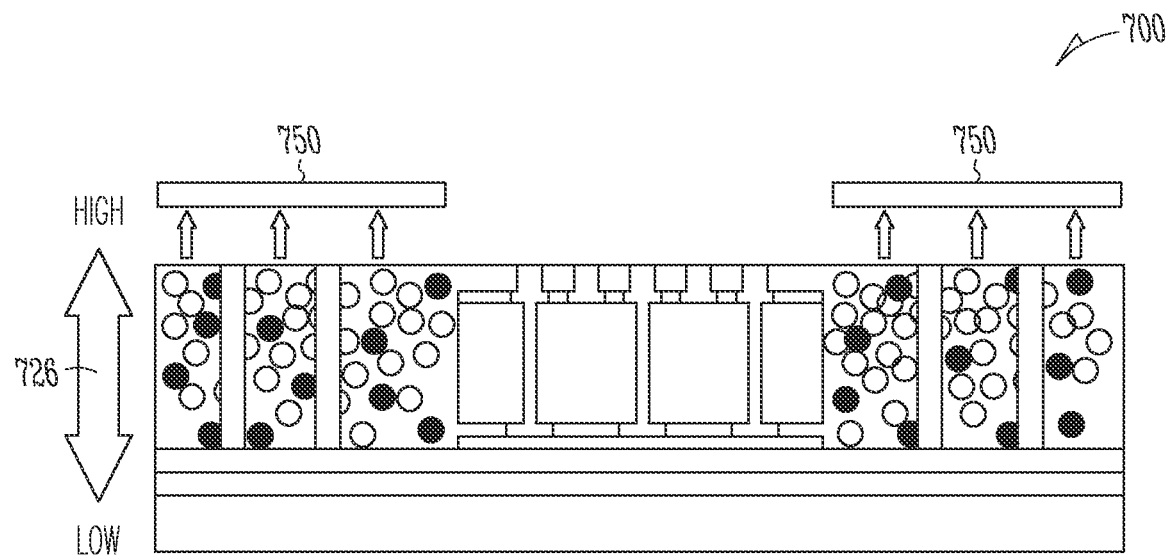
Figure 8D:
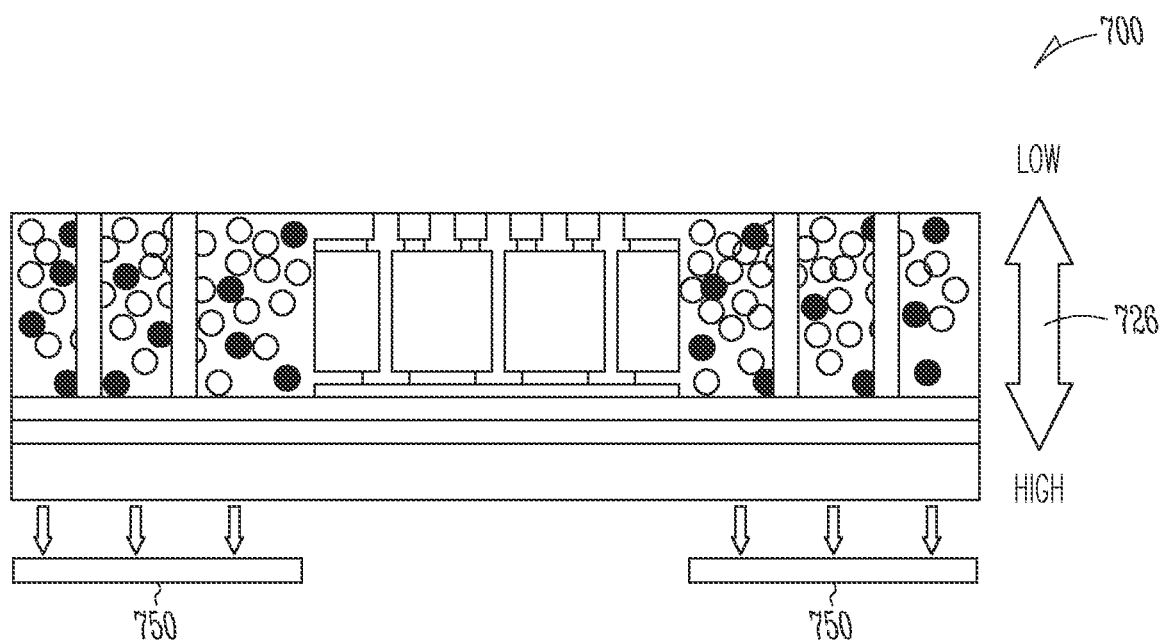

The mold layer 720 can be temperature heated (e.g., temperature increased) to reduce the mold matrix viscosity and allow movement of the magnetic filler particles 722 therein (FIG. 8C). If the assembly 700 is being built in a chamber with a magnetic pallet or plate 750, the magnetic filler particles 722 can migrate towards the plate 750 (FIG. 8D). When the plate 750 is at the top side, the magnetic filler particles 722 will gravitate that way. Conversely, when the plate 750 is on the bottom side, the magnetic filler particles 722 will gravitate that way.

FIGS. 9 to 11D relate to leveraging magnetic filler particles to create self-assembling power delivery pillars in a semiconductor package. Magnetic filler particles can be used in the mold layer to form self-assembled conductive pillars under magnetic alignment. These power delivery pillars can replace or supplement tall copper pillars, often made through lithography and plating, for power delivery through the assembly. By comparison, the use of magnetic filler particles to produce power delivery pillars can allow for better adhesion and resolution at a lower cost.

The power delivery pillars can be created, for example, by incorporating the magnetic filler particles as a secondary filler into a mold material and applying an external magnetic field to align the magnetic filler particles within the mold material. This can allow for creation of conductive pillars together with a mold encapsulation process, such as in a cost-effective single step.

Figure 9:
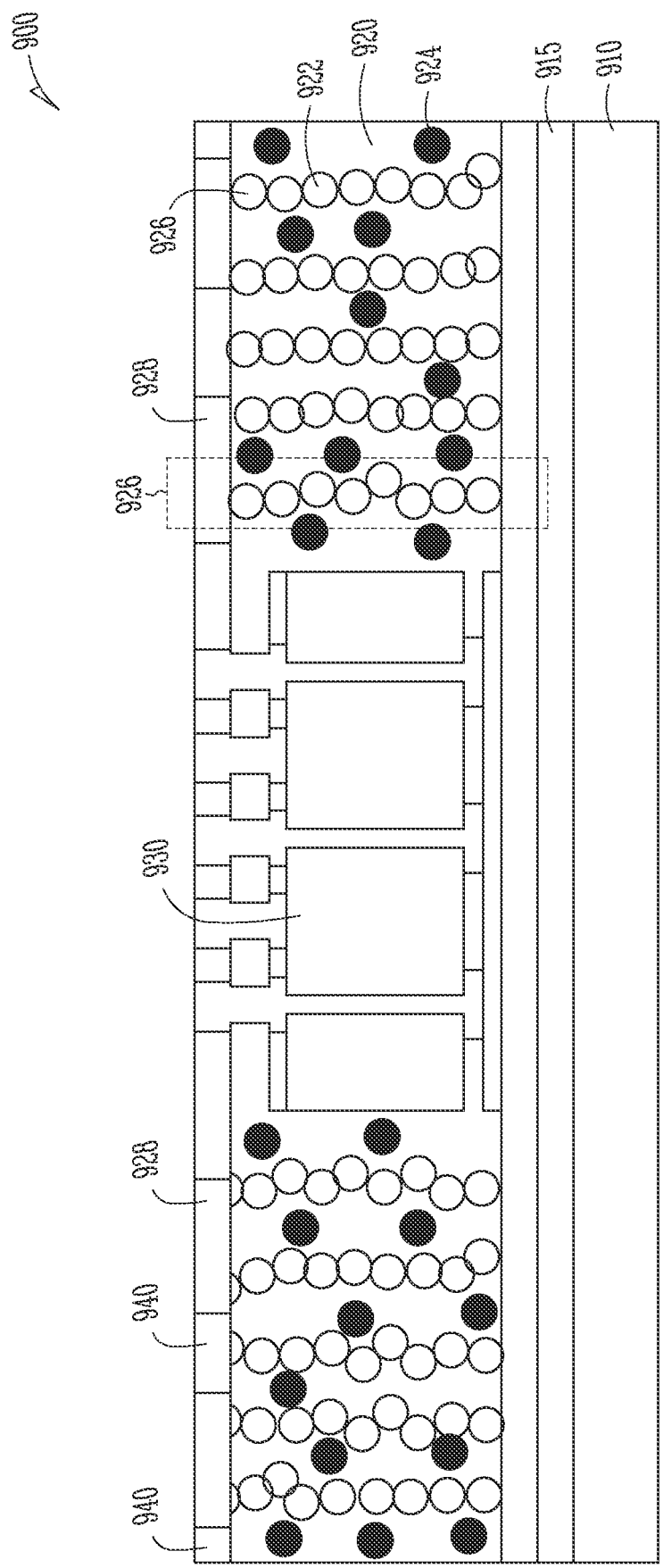
FIG. 9 illustrates a semiconductor interconnect incorporating self-assembled magnetic fillers in a mold matrix, in an example.

FIG. 9 illustrates a semiconductor assembly 900 incorporating self-assembled magnetic fillers in a mold matrix, in an example. The assembly 900 can include a carrier 910, intermediate layer 915, mold layer 920 with magnetic filler particles 922 and secondary filler particles 924, filler pillars 926, metal pads 928, a die 930, and a redistribution layer (RDL) 940.

The carrier 910 can be, for example, a glass carrier for production of the assembly 900. The carrier 910 can host the other components during assembly.

An intermediate layer 915 can reside on the carrier 910. Such an intermediate layer can be, for example, a glass substrate, silicon substrate, an adhesive layer such as for hosting the rest of the assembly 900. In some cases, the intermediate layer 915 can be one or more redistribution layers, such as layers of an organic material and a conductor.

The mold layer 920 can be built up from the intermediate layer 915 on the carrier 910. The mold layer can be, for example, a polymer layer surrounding the other components on the intermediate layer 915. In some cases, the mold layer 920 can be an epoxy. The mold layer 920 can include an array of filler particles, including the magnetic filler particles 922 and the secondary filler particles 924. Within the mold layer 920, the magnetic filler particles 922 can formed into the power delivery pillars 926.

The magnetic filler particles 922 can be ferromagnetic particles used for self-assembly of the power delivery pillars 926. In an example, the magnetic filler particles 922 can be nickel, cobalt iron, nickel iron, or other appropriate species. In some cases, non-ferromagnetic materials, such as copper or silver, can be coated with ferromagnetic materials and used as the magnetic filler particles 922. The ferromagnetic particles can have an average diameter of about less than one micron each.

The magnetic filler particles 922 can move around inside the mold layer 920 matrix and vertically aligned to form the power delivery pillars 926 under a magnetic field. This can be accomplished, for example, under parallel magnetic field within a short time. The secondary filler particles 924 can be non-magnetic filler particles that do not migrate into pillar formations. The mold layer 920 can then be cured to secure the conductive power delivery pillars 926.

The die 930 can include an interconnect bridge. In some cases, the die 930 can be a bridge for use with an active semiconductor device such as transistors, logic capability dies, memory dies, or combinations thereof. In one example, the die 930 can include an interconnect bridge. The interconnect bridge can be silicon, glass, organic, or other suitable bridge material. In one example, the die 930 can include one or more through vias, such as shown in FIG. 9. In some cases, the die 930 can transmit signals or power between additional dies using a top surface of the die 930 and through the die 930, allowing for connection, signal transmission, and power movement in both longitudinal and vertical directions.

The RDL 940 can be one or more layers, such as of a dielectric material, with one or more connections therethrough. Connections can include, for example, traces. The RDL 940 can help direct and connect the die 930. The metal pads 928 can be formed in the RDL 940 to define a conductive area in the assembly 900.

FIG. 10 illustrates magnetic filler particles 922 with a coating, in an example. In some cases, the magnetic filler particles 922 can be non-ferromagnetic materials coated with a shell of ferromagnetic material.

Figure 11A:
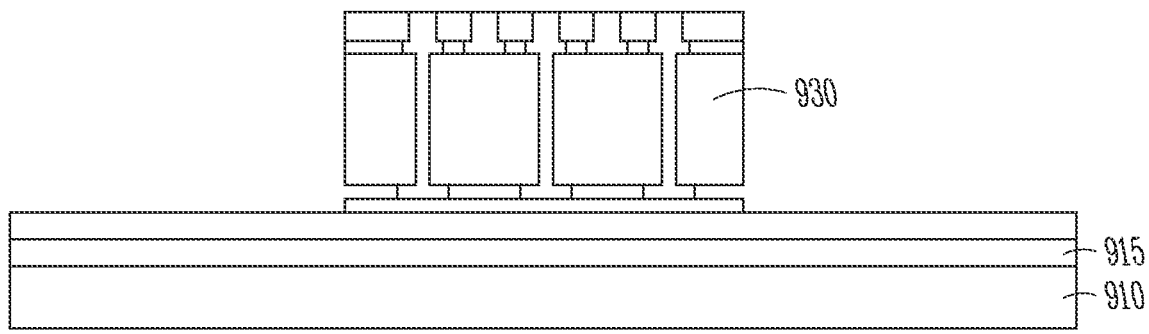
FIGS. 11A-11D illustrate a method of making a semiconductor interconnect incorporating magnetic filler particles in a mold material, in an example.
Figure 11B:
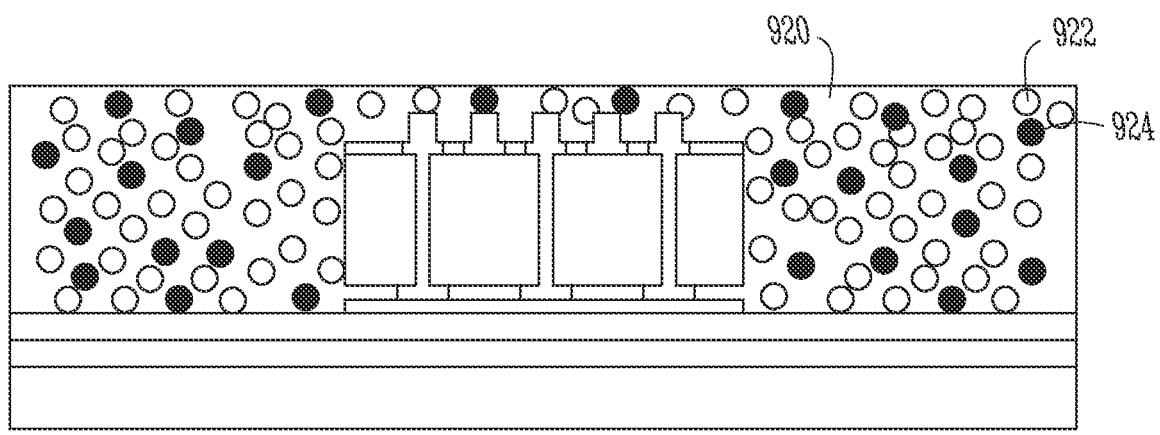

FIGS. 11A-11D illustrate a method of making a semiconductor assembly 900 incorporating magnetic filler particles in a mold material, in an example. First, the die 930 can be attached on the carrier 910 with a metal layer 911 (FIG. 11A). Next, the mold layer 920 can be applying to encapsulate the other components (FIG. 11B). During the mold process, the mold layer 920 can include the magnetic filler particles 922 can be in the mold material of the mold layer 920.

Figure 11C:
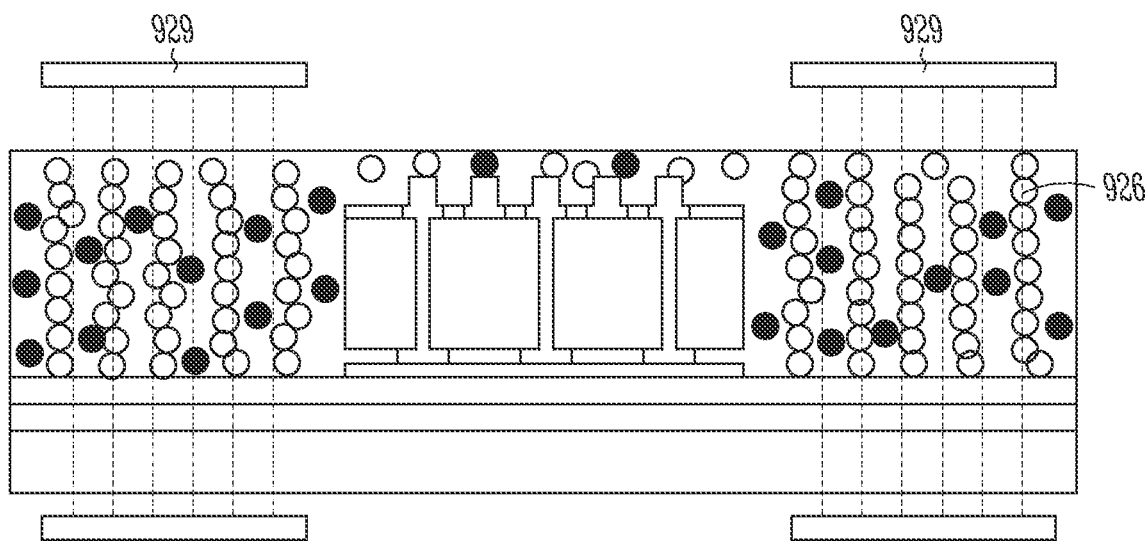
Figure 11D:
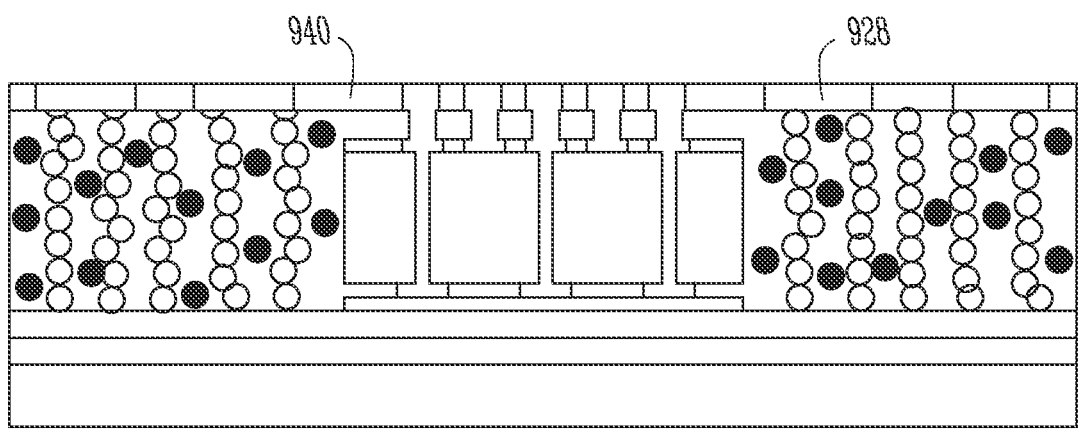

An external magnetic field can be applied to induce vertical alignment of the magnetic filler particles 922 in the mold layer 920 (FIG. 11C). The external magnetic field can be applied, for example, by magnetic pallets 929 (e.g., external magnets) in the mold chamber during manufacturing. The power delivery pillars 926 can be revealed (FIG. 11D) and defined by covering with metal pads 928 and PDL 940.

FIGS. 12A to 13D relate to magnetically aligning vias and creating mold etching or drilling pathways. In assembly of ODI packages, mold encapsulation is often used over large embedded dies and other features that benefit from specific mechanical, thermal, and dielectric requirements. This can be challenging to achieve with older lithography techniques.

Discussed here is the incorporation of ferromagnetic magnetic filler particles within a mold layer of a package to a enable magnetic field driven filler rearrangement and create low filler content paths. These low filler content paths can be leveraged for selective etching or drilling to create via. Such vias can be filled with a filler material to provide localized improvement to the mold layer. For example, a filler material can be used that increases heat dissipation or additional plating for a higher number of copper pillars.

Such etching or drilling paths can be made, for example, by incorporating magnetic filler particles as a secondary filler in a mold layer material, by rearranging the magnetic filler particles in the mold layer to create low filler content areas, and etching or drilling through the low filler content areas to create vias. Those vias can be filled or plated as desired. This can allow for localized modification of a mold layer to improve thermal and warpage control.

FIGS. 12A-12B illustrate a method of making drilling or etching pathways in a semiconductor assembly 1200 including magnetic filler particles, in an example. FIGS. 12A-12B provide an overview of magnetic filler particle rearrangement under a magnetic field to control and create etching or drilling paths, and localized modification of the mold layer. The assembly 1200 can include a carrier 1210, intermediate layer 1215, mold layer 1220 with magnetic filler particles 1222 and secondary filler particles 1224, low filler areas 1225, vias 1226, filler material 1228, a die 1230, and a redistribution layer (PDL) 1240.

The carrier 1210 can be, for example, a glass carrier for production of the assembly 1200. The carrier 1210 can host the other components during assembly. An intermediate layer 1215 can reside on the carrier 1210. Such an intermediate layer can be, for example, a glass substrate, silicon substrate, an adhesive layer such as for hosting the rest of the assembly 1200. In some cases, the intermediate layer 1215 can be one or more redistribution layers, such as layers of an organic material and a conductor. The mold layer 1220 can be built up from the intermediate layer 1215 on the carrier 1210. The mold layer can be, for example, a polymer layer surrounding the other components on the intermediate layer 1215. In some cases, the mold layer 1220 can be an epoxy. The mold layer 1220 can include an array of filler particles, including the magnetic filler particles 1222 and the secondary filler particles 1224. Within the mold layer 1220, the magnetic filler particles 1222 can move among the mold layer 1220 to allow for pathways to move into the vias 1226.

The magnetic filler particles 1222 can be ferromagnetic particles used for self-assembly of the vias 1226. In an example, the magnetic filler particles 1222 can be nickel, cobalt iron, nickel iron, or other appropriate species. In some cases, non-ferromagnetic materials, such as copper or silver, can be coated with ferromagnetic materials and used as the magnetic filler particles 1222. The ferromagnetic particles can have an average diameter of about less than one micron each.

The magnetic filler particles 1222 can move around inside the mold layer 1220 matrix to create low filler areas 1225, which can be etched or drilled to form the vias 1226. This can be accomplished, for example, under a magnetic field, such as a parallel magnetic field, within a short time. A parallel magnetic field can be used, for example, for planar movement of the magnetic filler particles 1222, but alternative magnetic fields can be used, such as magnetic fields configured to move particles to a periphery layer instead of a top or bottom. The secondary filler particles 1224 can be non-magnetic filler particles that do not migrate. The mold layer 1220 can then be cured to secure the low filler areas 1225.

The lower filler areas 1225 can be easily drilled or etched to create the vias 1226. These vias 1226 can be filled with the filler material 1223. The mold layer 1220 here can be interspersed with portions of the filler material 1223. The filler material 1222 can reside, for example, within vias 1226 made in the mold layer 1220 with etching or drilling. The filler material 1223 can serve a variety of thermal, mechanical, or other purposes within the mold layer 1220, and allow for a heterogeneous mold layer on the assembly 1200.

The filler material 1223 can be, for example, be used to provide additional localized modification to the mold layer 1220. For example, the filler material 1223 can be a thermally conductive material which provides thermal dissipation, such as a highly conductive metal (e.g., silver, aluminum, or others), carbon based fillers (e.g., graphite graphene, diamond), or a highly conductive ceramics (e.g., BN or AN). In some cases, the filler material 1223 can include a different filler, such as a magnetic filler material. In some cases, a different filler can be used in the filler material 1223, which would not otherwise be used globally in the assembly 1200 due to integration challenges. In some cases, use of a secondary or different filler in the filler material 1223 can provide additional mechanical benefit. Other example filler material 1223 can include, for example, liquid metal, stress absorbers, dielectric materials, magnetic materials, or others.

The die 1230 can include an interconnect bridge. In some cases, the die 1230 can be a bridge for use with an active semiconductor device such as transistors, logic capability dies, memory dies, or combinations thereof. In one example, the die 1230 can include an interconnect bridge. The interconnect bridge can be silicon, glass, organic, or other suitable bridge material. In one example, the die 1230 can include one or more through vias, such as shown in FIG. 12. In some cases, the die 1230 can transmit signals or power between additional dies using a top surface of the die 1230 and through the die 1230, allowing for connection, signal transmission, and power movement in both longitudinal and vertical directions.

The RDL 1240 can be one or more layers, such as of a dielectric material, with one or more connections therethrough. Connections can include, for example, traces. The RDL 1240 can help direct and connect the die 1230.

Figure 13A:
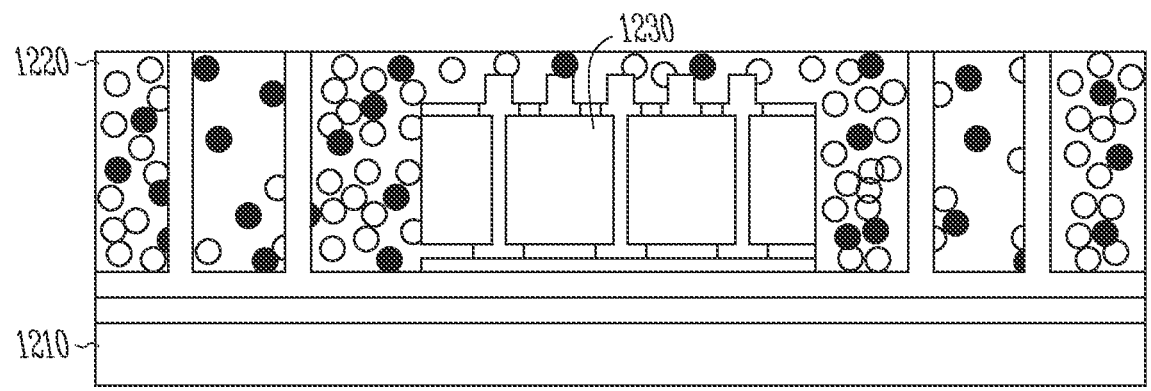
FIGS. 13A-13D illustrate a method of making drilling or etching pathways in a semiconductor interconnect including magnetic filler particles, in an example.

FIGS. 13A-13D illustrate a method of making drilling or etching pathways in a semiconductor assembly 1200 including magnetic filler particles, in an example. The assembly 1200 can be formed, for example, by providing panel level molding of the mold layer 1220 on the existing features such as the die 1230 (FIG. 13A).

Figure 13B:
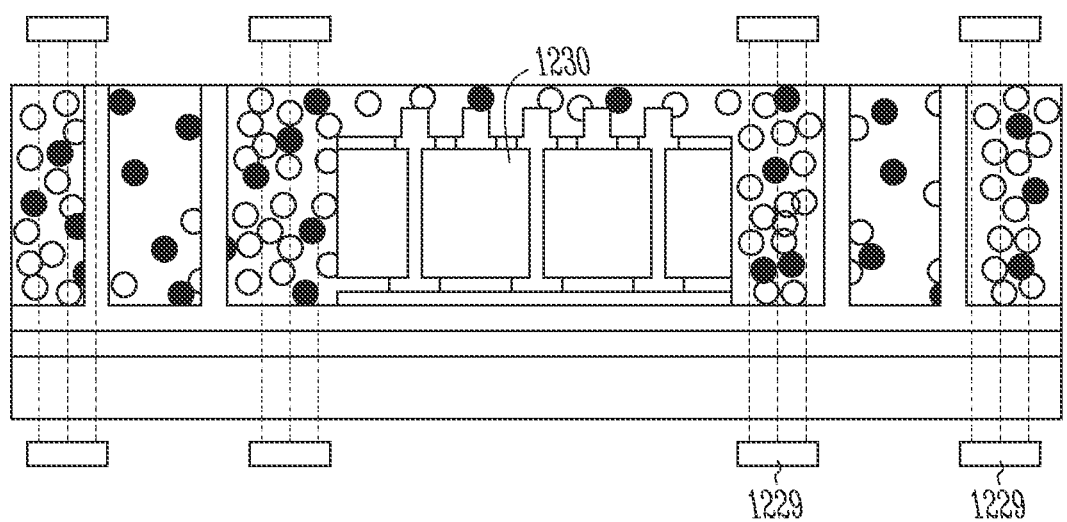

During the molding process, the mold layer 1220 can include the magnetic filler particles 1222, which can be rearranged with an external magnetic field (FIG. 13B). The magnetic filler particles 1222 can be rearranged to form specific low filler areas 1225. The external magnetic field can be applied, for example by external magnetic pallets 1229 in a mold chamber during manufacture.

Figure 13C:
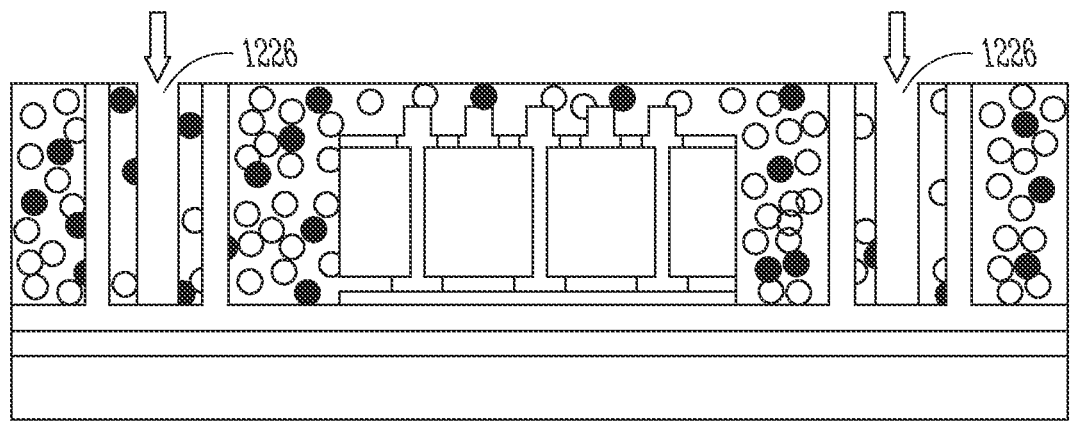
Figure 13D:
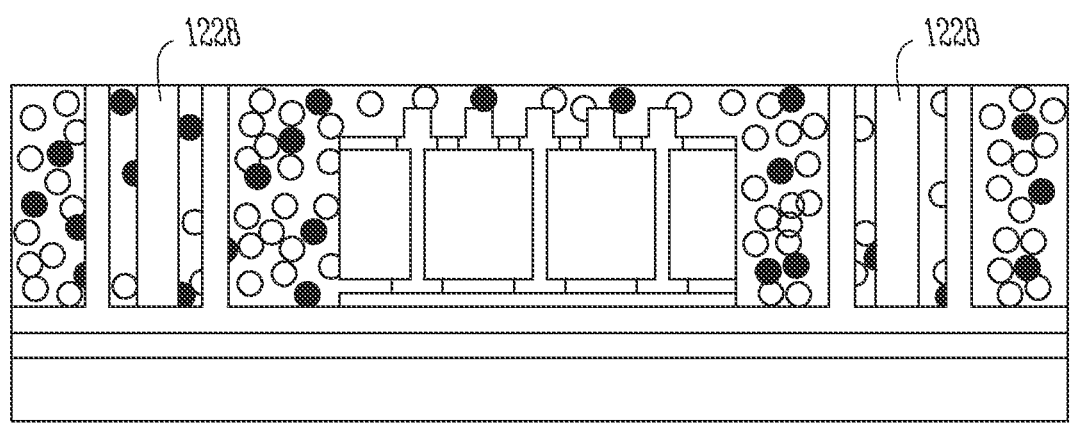

The mold layer 1220 can be ground to reveal features such as power delivery pillars. After the pillar reveal, vias 1226 can be created in the low filler areas 1225, such as by drilling or etching (FIG. 13C). The low filler areas 1225 can be filled with a filler material 1228, or by plating to create additional pillars. In some cases, the vias 1226 can be left open.

This type of architecture, with the magnetic filler particles 1222 in the mold layer 1220, can be detected by a cross-section inspection of the mold layer 1220. Under a microscope, a seconding filling, such as the magnetic filler particles 1222, and the power delivery pillars can be detected. Such material can be viewed for example, by SEM. Cross sections can also be used to detect localized modification in the mold layer 1220.

Figure 14:
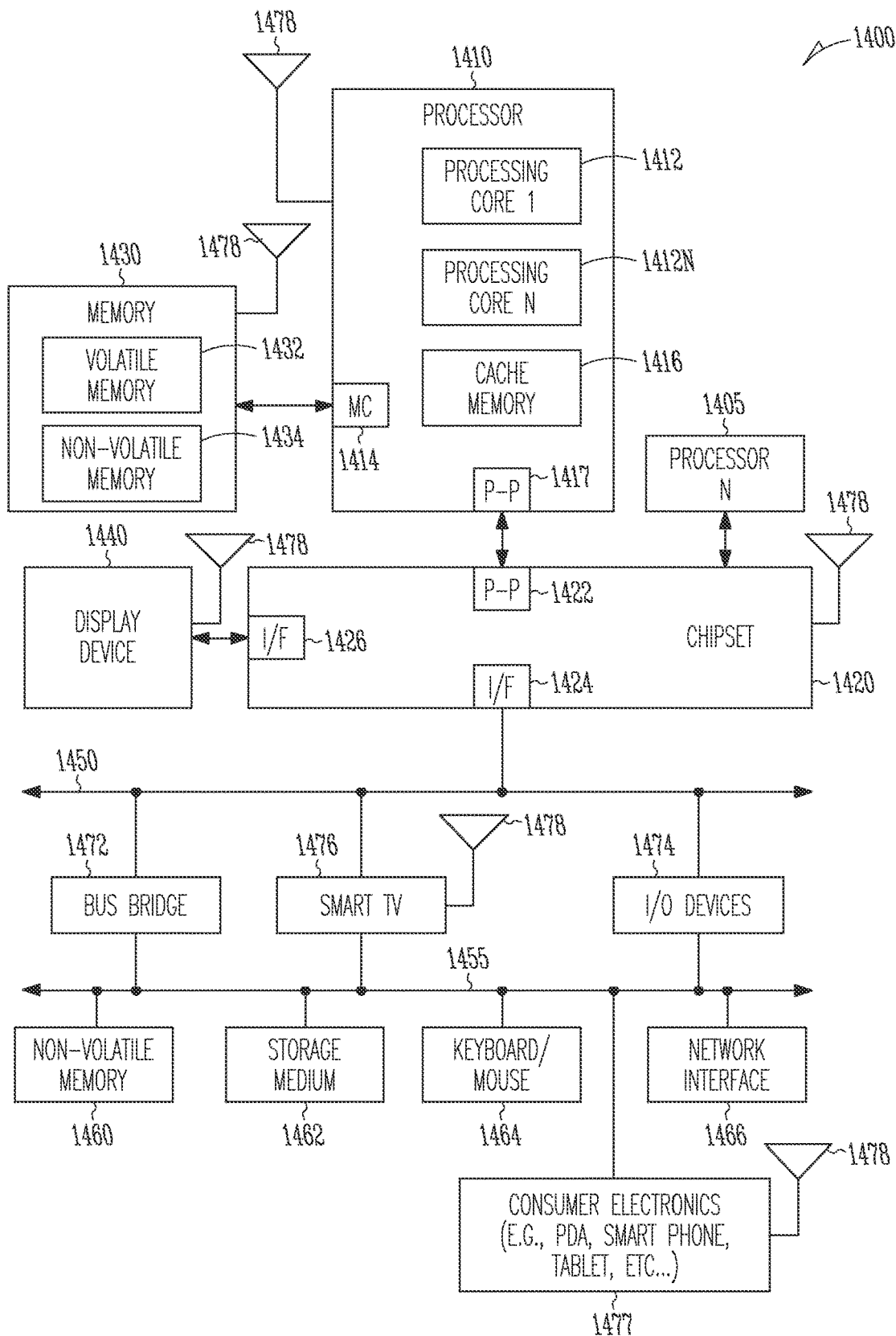
FIG. 14 illustrates a system level diagram, depicting an example of an electronic device.

FIG. 14 illustrates a system level diagram, depicting an example of an electronic device (e.g., system) that may include interconnect assemblies including magnetic filler materials as described in the examples above. In one embodiment, system 1400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1400 includes a system on a chip (SOC) system.

In one embodiment, processor 1410 has one or more processor cores 1412 and 1412N, where 1412N represents the Nth processor core inside processor 1410 where N is a positive integer. In one embodiment, system 1400 includes multiple processors including 1410 and 1405, where processor 1405 has logic similar or identical to the logic of processor 1410. In some embodiments, processing core 1412 includes, but is not limited to, pre-fetch logic to fetch instructions, decode logic to decode the instructions, execution logic to execute instructions and the like. In some embodiments, processor 1410 has a cache memory 1416 to cache instructions and/or data for system 1400. Cache memory 1416 may be organized into a hierarchal structure including one or more levels of cache memory.

In some cases, one or more processor dies, cores 1412, or other active dies can be interconnected using examples of interconnect assemblies leveraging magnetic particles, such as those assemblies discussed in the examples above.

In some embodiments, processor 1410 includes a memory controller 1414, which is operable to perform functions that enable the processor 1410 to access and communicate with memory 1430 that includes a volatile memory 1432 and/or a non-volatile memory 1434. In some embodiments, processor 1410 is coupled with memory 1430 and chipset 1420. Processor 1410 may also be coupled to a wireless antenna 1478 to communicate with any device configured to transmit and/or receive wireless signals. In one embodiment, an interface for wireless antenna 1478 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1434 includes, but is not limited to, flash memory, phase change memory (PCM), read-only memory (ROM), electrically erasable programmable read-only memory (EEPROM), or any other type of non-volatile memory device.

Memory 1430 stores information and instructions to be executed by processor 1410. In one embodiment, memory 1430 may also store temporary variables or other intermediate information while processor 1410 is executing instructions. In the illustrated embodiment, chipset 1420 connects with processor 1410 via Point-to-Point (PtP or P-P) interfaces 1417 and 1422. Chipset 1420 enables processor 1410 to connect to other elements in system 1400. In some embodiments of the example system, interfaces 1417 and 1422 operate in accordance with a PtP communication protocol such as the Intel® QuickPath Interconnect (QPI) or the like. In other embodiments, a different interconnect may be used.

In some embodiments, chipset 1420 is operable to communicate with processor 1410, 1405N, display device 1440, and other devices, including a bus bridge 1472, a smart TV 1476, I/O devices 1474, nonvolatile memory 1460, a storage medium (such as one or more mass storage devices) 1462, a keyboard/mouse 1464, a network interface 1466, and various forms of consumer electronics 1477 (such as a PDA, smart phone, tablet etc.), etc. In one embodiment, chipset 1420 couples with these devices through an interface 1424. Chipset 1420 may also be coupled to a wireless antenna 1478 to communicate with any device configured to transmit and/or receive wireless signals. In one example, any combination of components in a chipset may be separated by a continuous flexible shield as described in the present disclosure.

Chipset 1420 connects to display device 1440 via interface 1426. Display 1440 may be, for example, a liquid crystal display (LCD), a light emitting diode (LED) array, an organic light emitting diode (OLED) array, or any other form of visual display device. In some embodiments of the example system, processor 1410 and chipset 1420 are merged into a single SOC. In addition, chipset 1420 connects to one or more buses 1450 and 1455 that interconnect various system elements, such as I/O devices 1474, non-volatile memory 1460, storage medium 1462, a keyboard/mouse 1464, and network interface 1466. Buses 1450 and 1455 may be interconnected together via a bus bridge 1472.

In one embodiment, mass storage device 1462 includes, but is not limited to, a solid state drive, a hard disk drive, a universal serial bus flash memory drive, or any other form of computer data storage medium. In one embodiment, network interface 1466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 14 are depicted as separate blocks within the system 1400, the functions performed by some of these blocks may be integrated within a single semiconductor circuit or may be implemented using two or more separate integrated circuits. For example, although cache memory 1416 is depicted as a separate block within processor 1410, cache memory 1416 (or selected aspects of 1416) can be incorporated into processor core 1412.

VARIOUS NOTES & EXAMPLES

To better illustrate the method and apparatuses disclosed herein, a non-limiting list of embodiments is provided here:

Example 1 can include a semiconductor assembly comprising: a mold layer having a first side and a second side, the mold layer comprising a mold material, a first filler material dispersed in the mold material, and a second filler material dispersed in the mold material, wherein the second filler material includes magnetic particles; a die embedded in the mold layer; and one or more power delivery pillars extending in the mold layer from the first side to the second side.

Example 2 can include Example 1, wherein the second filler material comprises nickel, cobalt iron, nickel iron, or combinations thereof.

Example 3 can include Example 1, wherein the second filler material comprises particles having an average diameter of about less than one micron each.

Example 4 can include Example 1, wherein the second filler material is heterogeneously dispersed within the mold layer.

Example 5 can include a semiconductor assembly configured for omnidirectional function, the assembly comprising: a mold layer having a first side and a second side, the mold layer comprising: a mold material; a first filler material dispersed in the mold material; and a second filler material dispersed in the mold material; wherein the second filler material includes magnetic particles; a die embedded in the mold layer; one or more power delivery pillars extending in the mold layer from the first side to the second side; and a ferromagnetic layer plated on the one or more power delivery pillars, wherein the second filler material is more densely dispersed within the mold layer adjacent the one or more power delivery pillars.

Example 6 can include Example 5, wherein the one or more power delivery pillars each comprise copper pillars.

Example 7 can include Example 5, wherein the ferromagnetic layer comprises plated nickel.

Example 8 can include a method of making a semiconductor assembly, the method comprising: building power delivery pillars on a carrier material; plating a ferromagnetic material onto the power delivery pillars to create a plated layer; mounting a die on the carrier material; encapsulating the power delivery pillars and the die with a mold layer, the mold layer comprising a mold mated al, a first filler material, and a second filler material, wherein the second filler material comprises ferromagnetic particles; allowing the ferromagnetic particles to migrate towards the plated layer; and curing the mold layer.

Example 9 can include Example 8, further comprising forming metallic routing on a carrier material for power delivery pillar formation.

Example 10 can include Example 8, further comprising forming connections between the power delivery pillars.

Example 11 can include Example 10, wherein forming connections comprises applying a redistribution layer.

Example 12 can include a semiconductor assembly configured for omnidirectional function, the assembly comprising: a mold layer having a first side and a second side, a die embedded in the mold layer; one or more power delivery pillars extending in the mold layer from the first side to the second side; one or more vias extending in the mold layer from the first side to the second side, each of the one or more vias filled with a filler material.

Example 13 can include Example 12, wherein the filler material comprises a thermally conductive material.

Example 14 can include Example 13, wherein the filler material comprises silver, aluminum, graphite, graphene, diamond, or combinations thereof.

Example 15 can include Example 12, wherein the filler material comprises a magnetic filler material.

Example 16 can include Example 12, wherein the filler material comprises a liquid metal, stress absorber material, dielectric material, or combinations thereof.

Example 17 can include a method of making a semiconductor assembly, the method comprising: building power delivery pillars on a carrier material; forming sacrificial pillars on the carrier material; mounting a die; encapsulating the power delivery pillars, the sacrificial pillars, and the die with a mold layer; forming vias by removing the sacrificial pillars; and filling the vias with a filler material.

Example 18 can include Example 17, wherein forming sacrificial pillars on the carrier material comprises applying a photoresist material, a thermally decomposable material, a high dry etch rate material, or a copper material.

Example 19 can include Example 17, wherein forming vias by removing the sacrificial pillars comprises removing the sacrificial pillars by stripping chemistry, thermal degradation, plasma dry etching, or copper wet etching.

Example 20 can include Example 17, wherein filling the vias with a filler material comprises stencil printing, jetting, or molding the filler material.

Example 21 can include a semiconductor assembly configured for omnidirectional function, the assembly comprising: a mold layer having a first side and a second side, the mold layer comprising: a mold material; a first filler material dispersed in the mold material; and a second filler material dispersed in the mold material; wherein the second filler material includes magnetic particles; a die embedded in the mold layer; one or more power delivery pillars extending in the mold layer from the first side to the second side; and wherein the second filler material is more densely dispersed within the mold layer along a gradient between the first side and the second side.

Example 22 can include Example 21, wherein the gradient becomes denser from the first side to the second side.

Example 23 can include Example 21, wherein the gradient becomes denser from the second side to the first side.

Example 24 can include Example 21, wherein the gradient corresponds to a change in coefficient of thermal expansion within the assembly.

Example 25 can include a method of making a semiconductor assembly, the method comprising: building power delivery pillars on a carrier material; mounting a die on the carrier material; encapsulating the power delivery pillars and the die with a mold layer, the mold layer comprising a mold material, a first filler material, and a second filler material, wherein the second filler material comprises ferromagnetic particles; creating a gradient of the second filler material within the mold layer by applying an external magnetic field; and curing the mold layer.

Example 26 can include Example 25, wherein applying an external magnetic field comprises applying one or more magnetic palates to the mold layer.

Example 27 can include a semiconductor assembly configured for omnidirectional function, the assembly comprising: a mold layer having a first side and a second side, the mold layer comprising: a mold material; a first filler material dispersed in the mold material; and a second filler material dispersed in the mold material; wherein the second filler material includes magnetic particles; a die embedded in the mold layer; and one or more power delivery pillars extending in the mold layer from the first side to the second side, the one or more power delivery pillars comprising the second filler material.

Example 28 can include Example 27 further comprising a dielectric layer on one of the first and second sides of the mold layer.

Example 29 can include Example 28, further comprising one or more metallic plates in the dielectric layer, each of the one or more metallic plates aligned with the one or more power delivery pillars.

Example 30 can include Example 27, wherein the second filler material comprises particles coated in a ferromagnetic material.

Example 31 can include Example 30, wherein the ferromagnetic material comprises silver.

Example 32 can include a method of making a semiconductor assembly, comprising: mounting a die on a carrier material; encapsulating the die with a mold layer, the mold layer comprising a mold material, a first filler material, and a second filler material, wherein the second filler material comprises ferromagnetic particles; creating one or more power delivery pillars with the second filler material by applying an external magnetic field; and curing the mold layer.

Example 33 can include Example 32, wherein applying an external magnetic field comprising using one or more external magnetic pallets.

Example 34 can include Example 32, further comprising forming one or more metallic pads corresponding to the one or more power delivery pillars.

Example 35 can include a semiconductor assembly configured for omnidirectional function, the assembly comprising: a mold layer having a first side and a second side, the mold layer comprising: a mold material; a first filler material dispersed in the mold material; a second filler material dispersed in the mold material; wherein the second filler material includes magnetic particles, wherein the second filler material is heterogeneously dispersed within the mold layer; and one or more low filler areas with a lesser density of the second filler material compared to one or more high filler areas; a die embedded in the mold layer; one or more power delivery pillars extending in the mold layer from the first side to the second side; and one or more vias extending in the mold layer from the first side to the second side, the one or more vias located in the one or more low filler areas.

Example 36 can include Example 35, further comprising a filler material filling the one or more vias.

Example 37 can include Example 36, wherein the filler material comprises a thermally conductive material.

Example 38 can include Example 36, wherein the filler material comprises silver, aluminum, graphite, graphene, diamond, or combinations thereof.

Example 39 can include Example 36, wherein the filler material comprises a magnetic filler material.

Example 40 can include Example 36, wherein the filler material comprises a liquid metal, stress absorber material, dielectric material, or combinations thereof.

Example 41 can include a method of making a semiconductor assembly, the method comprising: building power delivery pillars on a carrier material; mounting a die; encapsulating the power delivery pillars and the die with a mold layer, the mold layer comprising a mold material, a first filler material dispersed in the mold material, and a second filler material dispersed in the mold material, wherein the second filler material includes magnetic particles; applying an external magnetic field to induce heterogeneous migration of the second filler material and create high filler areas and low filler areas; and making vias in the low filler areas.

Example 42 can include Example 41, wherein making vias comprises drilling vias.

Example 43 can include Example 41, herein making vias comprises etching vias.

Example 44 can include Example 41, further comprising filling the vias with a filler material.

Example 45 can include Example 44, wherein filling the vias comprises stencil printing, jetting, or molding.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

What is claimed is:

1. A semiconductor interconnect assembly comprising:
    a mold layer having a first side and a second side, the mold layer comprising a mold material, a first filler material dispersed in the mold material, and a second filler material dispersed in the mold material, wherein the second filler material includes magnetic particles;
    a die embedded in the mold layer;
    one or more pillars extending in the mold layer from the first side to the second side; and
    wherein the second filler material is more densely dispersed within the mold layer along a gradient between the first side and the second side.

2. The assembly of claim 1, wherein the second filler material comprises nickel, cobalt iron, nickel iron, or combinations thereof.

3. The assembly of claim 1, wherein the second filler material comprises particles having an average diameter of about less than one micron each.

4. The assembly of claim 1, wherein the second filler material is heterogeneously dispersed within the mold layer.

5. The assembly of claim 1, wherein the die comprises an interconnect bridge die.

6. The assembly of claim 5, wherein the interconnect bridge die comprises one or more through die vias for communication from a top side to a bottom side of the interconnect bridge.

7. The assembly of claim 1, wherein the pillars comprise power delivery pillars, data transmission pillars, or an inductor.

8. The assembly of claim 1, wherein the second filler material is densely dispersed within the mold layer adjacent the one or more pillars.

9. The assembly of claim 1, further comprising one or more vias extending in the mold layer from the first side to the second side, each of the one or more vias filled with the second filler material.

10. The assembly of claim 1, wherein the one or more pillars comprise the second filler material.

11. The assembly of claim 1, further comprising one or more low filler areas with a lesser density of the second filler material compared to one or more high filler areas; and
    one or more vias extending in the mold layer from the first side to the second side, the one or more vias located in the one or more low filler areas.

12. A semiconductor assembly comprising:
    a layer having a first side and a second side, the layer comprising:
        a resin material;
        magnetic particles dispersed in the resin material; and
        dielectric particles dispersed in the resin material;
    a bridge die embedded in the layer;
    one or more pillars extending in the layer from the first side to the second side; and
    a ferromagnetic layer on the one or more pillars,
    wherein the magnetic particles are more densely dispersed within the layer adjacent the one or more pillars.

13. The assembly of claim 12, wherein the one or more pillars each comprise copper pillars.

14. The assembly of claim 12, wherein the one or more pillars each comprise power delivery pillars.

15. A semiconductor assembly comprising:
    a mold layer having a first side and a second side, the mold layer comprising a mold material, a first filler material dispersed in the mold material, and a second filler material dispersed in the mold material, wherein the second filler material includes magnetic particles;
    one or more low filler areas with a lesser density of the second filler material compared to one or more high filler areas;
    a bridge die embedded in the mold layer;
    one or more power delivery pillars extending in the mold layer from the first side to the second side; and
    one or more vias extending in the mold layer from the first side to the second side, the one or more vias located in the one or more low filler areas.

16. The assembly of claim 15, wherein the second filler material comprises a thermally conductive material.

17. The assembly of claim 16, wherein the magnetic particles comprise silver, aluminum, graphite, graphene, diamond, or combinations thereof.

18. The assembly of claim 15, wherein the mold material further comprises a liquid metal, stress absorber material, dielectric material, or combinations thereof.

* * * * *